United States Patent
Jain

(10) Patent No.: US 9,166,363 B2
(45) Date of Patent: Oct. 20, 2015

(54) ENHANCED OPTICAL GAIN AND LASING IN INDIRECT GAP SEMICONDUCTOR THIN FILMS AND NANOSTRUCTURES

(71) Applicant: Faquir C. Jain, Storrs, CT (US)

(72) Inventor: Faquir C. Jain, Storrs, CT (US)

(*) Notice: Subject to any disclaimer, the term of this patent is extended or adjusted under 35 U.S.C. 154(b) by 0 days.

(21) Appl. No.: 14/145,656

(22) Filed: Dec. 31, 2013

(65) Prior Publication Data

US 2014/0185640 A1  Jul. 3, 2014

Related U.S. Application Data

(60) Provisional application No. 61/747,849, filed on Dec. 31, 2012.

(51) Int. Cl.
| | | |
|---|---|---|
| *H01S 5/00* | (2006.01) | |
| *H01S 5/02* | (2006.01) | |
| *B82Y 20/00* | (2011.01) | |
| *H01S 3/30* | (2006.01) | |
| *H01S 5/062* | (2006.01) | |
| *H01S 5/10* | (2006.01) | |
| *H01S 5/20* | (2006.01) | |
| *H01S 5/34* | (2006.01) | |
| *H01S 5/40* | (2006.01) | |
| *H01S 5/32* | (2006.01) | |

(52) U.S. Cl.
CPC ............. *H01S 5/021* (2013.01); *B82Y 20/00* (2013.01); *H01S 5/3412* (2013.01); *H01S 5/3427* (2013.01); *H01S 3/30* (2013.01); *H01S 5/06203* (2013.01); *H01S 5/10* (2013.01); *H01S 5/2009* (2013.01); *H01S 5/3214* (2013.01); *H01S 5/3403* (2013.01); *H01S 5/4025* (2013.01)

(58) Field of Classification Search
CPC ... H01S 5/3013; H01S 5/0014; H01S 5/0218; H01S 5/34; H01L 29/267
USPC .......................... 257/17; 372/45.012; 977/774
See application file for complete search history.

(56) References Cited

U.S. PATENT DOCUMENTS

| | | | |
|---|---|---|---|
| 8,193,523 B2* | 6/2012 | Pillarisetty et al. | 257/14 |
| 8,610,232 B2* | 12/2013 | Coe-Sullivan et al. | 257/448 |
| 2004/0021138 A1* | 2/2004 | Shields et al. | 257/17 |
| 2012/0280208 A1* | 11/2012 | Jain | 257/20 |

* cited by examiner

*Primary Examiner* — Tuan Nguyen
(74) *Attorney, Agent, or Firm* — Steven M. McHugh

(57) ABSTRACT

Structures and methodologies to obtain lasing in indirect gap semiconductors such as Ge and Si are provided and involves excitonic transitions in the active layer comprising of at least one indirect gap layer. Excitonic density is increased at a given injection current level by increasing their binding energy by the use of quantum wells, wires, and dots with and without strain. Excitons are formed by holes and electrons in two different layers that are either adjacent or separated by a thin barrier layer, where at least one layer confining electrons and holes is comprised of indirect gap semiconductor such as Si and Ge, resulting in high optical gain and lasing using optical and electrical injection pumping.

20 Claims, 22 Drawing Sheets

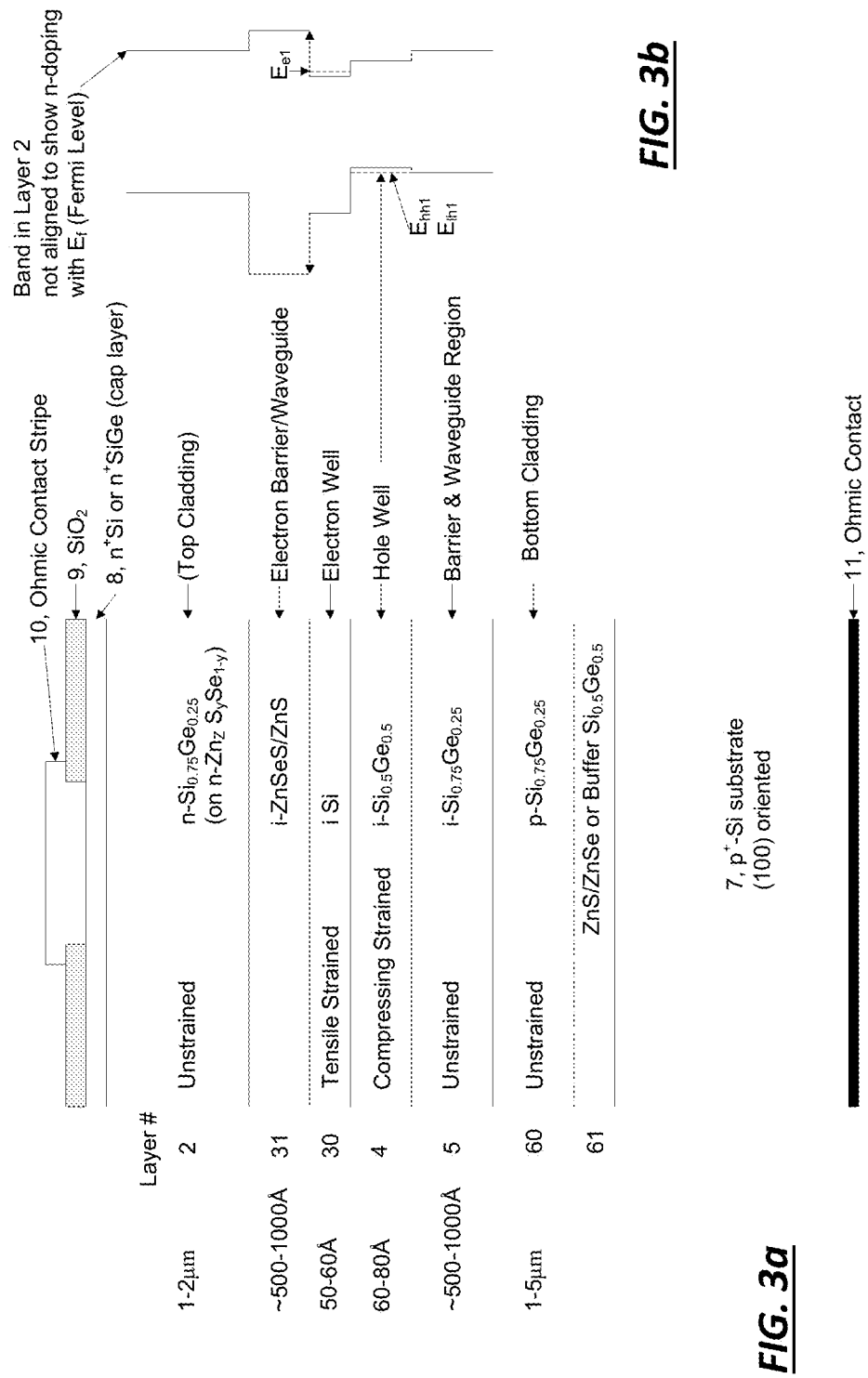

ENHANCED OPTICAL GAIN AND LASING IN INDIRECT GAP SEMICONDUCTOR THIN FILMS AND NANOSTRUCTURES

CROSS REFERENCE TO RELATED APPLICATIONS

This application claims benefit of priority of the filing date of U.S. Provisional Patent Application No. 61/747,849 filed Dec. 31, 2012, the contents of which are incorporated herein by reference in its entirety.

FIELD OF THE INVENTION

The present invention relates to light-emitting and lasing structures, and more particularly to achieving enhanced optical gain and Lasing in semiconductor thin films and nanostructure materials.

BACKGROUND OF THE INVENTION

Lasing in direct energy gap semiconductors has been well known since the 1960s when low-temperature GaAs homojunctions lasers and subsequently room temperature AlGaAs—GaAs double heterojunction lasers were first reported. This was followed by the development of quantum well, quantum wire and more recently, quantum dot lasers. Both edge-emitting and surface-emitting configurations are also well known in the prior art. Semiconductor lasers are fabricated using direct gap materials active layers such as GaAs, InGaAs, InGaAsP, ZnCdSe, and GaN. Unfortunately, this precludes using widely used materials such as Si (the mainstay of integrated circuit industry), Ge, GaP, and other compound semiconductors for fabrication. While most of the semiconductor lasers were reported in inorganic semiconductors, organic semiconductor lasers have also been reported.

It should be appreciated that light emission in indirect energy gap semiconductors, such as Silicon, gallium phosphide (GaP) and other indirect energy gap materials, exhibit significantly lower quantum efficiency $\eta_q$ and, hence, optical gain when p-n junctions are configured as lasers and result in impractical threshold current density values. In the case of indirect gap semiconductors, such as Si and Ge, on calculation determined that the free carrier absorption is considerably higher than the gain produced by the current injection. Recently, lasing in Ge film grown on Si is also reported with threshold current density over 100 kA/cm². Additionally, Si Raman lasers operating at photon energies below the band gap have been reported using optical pumping. Tensile strained Ge lasers are also proposed. Unfortunately, the limitations associated with band-filling and tensile-strained Ge structures have not resulted in lasers with acceptable threshold current densities from practical on-chip integration perspective. Excitonic formation in GaP:N or GaAsP:N layers is well known to result in efficient light emission in p-n junctions (when the composition makes the band gap to be indirect, i.e. phosphorus in excess of 44%). However, the threshold current density is very high in this type of system, and as a result one has to operate at lower temperatures (below 77K) to obtain stimulated emission. Another way of looking at it is that the binding energy of excitons in bulk is about 4 meV. The threshold current density and operating temperature can be improved by enhancing the exciton binding energy. No reports are available which describes significant formation of excitons (and eventual lasing) without the doping of isoelectronic impurities such as nitrogen in GaP.

The optical gain has been shown to increase in active layers realized in indirect gap materials by introducing shallow isoelectronic impurities such as N and Bi in GaP or GaAsP. For these impurities, the electron states are highly localized forming bound excitons. The electronic state is primarily made of conduction band Bloch functions, relevant to the central region of the Brillouin zone. The electron-hole pairs, forming the excitons, recombine via vertical transitions, yielding low radiative lifetime $\tau_r$ and high internal quantum efficiency $\eta_q$. It has been demonstrated that the excitonic transition corresponding to A-line in InGaP:N can give lasing when the composition of the active layer is such that its energy gap crosses over slightly to the indirect side. Quantum Confined Stark Effect (QCSE), which depends on the existence of excitons, has not been observed in type-I SiGe/Si multiple quantum wells (MQWs). This is attributed to the lack of appropriate quantum well barrier heights (or offsets) for electrons ($\Delta E_c$) and holes ($\Delta E_v$) in the conduction and valence band, respectively. In the case of Si—Ge system, the magnitude of conduction and valence band offsets can be increased if type II heterojunctions are used. It has been reported that layering structure can be used to obtain these offsets. Active layers comprising of type-II strained-layer SiGe/Si quantum wells, wires and dots are described for obtaining lasing. Recently, lasing has been reported in Ge layers grown on Si at threshold current density of about 300KA/cm². This threshold permits use as pulsed laser. In comparison to direct lasers, the threshold current density is about 3 orders of magnitude higher.

SUMMARY OF THE INVENTION

It should be appreciated that at least one embodiment of the invention involves structures and methodologies to obtain lasing in Ge, SiGe, Si, GaAsP/GaP, and other indirect gap materials. It involves use of excitonic transitions (in place of free electron-hole transitions) which yield higher internal quantum efficiency in generating photons. Several laser structures are described which result in increased density of excitons in the active layer to enhance optical gain and reduce the threshold current density. Excitonic density is increased at a given injection current level by increasing their binding energy by various means including the use of quantum wells, wires, and dots in relaxed or strained configurations. In some embodiments of the invention described herein involves structures where high binding energy excitons are formed by holes and electrons in two different layers that are either adjacent or separated by a thin barrier layer, where at least one layer is comprised of indirect gap semiconductor such as Si and Ge, resulting in high optical gain and lasing using optical and electrical current injection pumping. In one embodiment, structures are described where excitons are formed by electron in direct gap semiconductor layer and holes in the indirect gap layers; where layers are adjacent or separated by a thin barrier layer. Excitonic density is increased at a given injection current level by increasing their binding energy by various means including the use of quantum wells, wires, and dots in relaxed or pseudomorphic strained form. The light emitting structures may be configured as p-n junction and metal-oxide-semiconductor (MOS) type. In the case of MOS structures in one embodiment, electrons from the inversion layer, formed under the gate at voltages above threshold, are injected into one or more layers comprising of quantum wells (1-dimensional confinement), quantum wires (2-d confinement) and quantum dots (3-dimensional confinement) structures. The recombination of electrons and holes, directly or via exciton formation, produces lasing in active layer comprising of dots/wells. N-p-n bipolar transistor structures can also be configured as lasers.

Still in another embodiment, lasing takes place in a layer which may include an array of $GeO_x$-cladded Ge quantum dots, forming a quantum dot superlattice (QDSL), resulting in ultra-narrow mini energy bands corresponding to indirect and direct gap states. The electron and holes are injected in the $GeO_x$—Ge QDSL layer either by using a modified MOS structure of a p-n junction. The level of injected minority carriers is such that they fill the narrow mini-band in the conduction band corresponding to indirect gap (0.67 eV) states in L valley, enabling carrier overflow to mini-band corresponding to direct gap (0.8 eV) states [22]. Carriers are confined by incorporating electron and hole barriers and photons are confi„ed by lower index of refraction upper and lower cladding.

In another embodiment, light emission and lasing takes place in tensile strained Ge quantum dots realized on Si substrates using nano-interface and nano-island formation techniques. In another embodiment where lasing takes place in direct gap layers comprising quantum wells/dots, structures are realized on indirect gap semiconductors such as Si and Ge. Thin active layers of direct gap semiconductors selected from InGaAs, InGaAsP, GaSb/GaAs are implemented on Si epitaxial films on Si-on-Insulator (SOI) substrates using dislocation reduction nanointerfaces. The laser structures are envisioned in edge-emitting and surface emitting configurations. In addition, distributed feedback lasers are envisioned.

BRIEF DESCRIPTION OF THE DRAWINGS

The foregoing and other features and advantages of the present invention will be more fully understood from the following detailed description of illustrative embodiments, taken in conjunction with the accompanying figures in which like elements are numbered alike:

FIG. 3a shows Type II energy band alignment in a SiGe—Si system to obtain separate electron and hole confinement, in accordance with an embodiment of the present invention.

FIG. 3b is an energy band diagram showing electrons in Si well and holes in a Si0.5Ge0.5 compressively strained quantum well and shows a 3-Dimensional view of 2-channel SWS-FET showing two separate drains, one source and one gate, in accordance with an embodiment of the present invention.

DETAILED DESCRIPTION OF THE INVENTION

Figure 1:
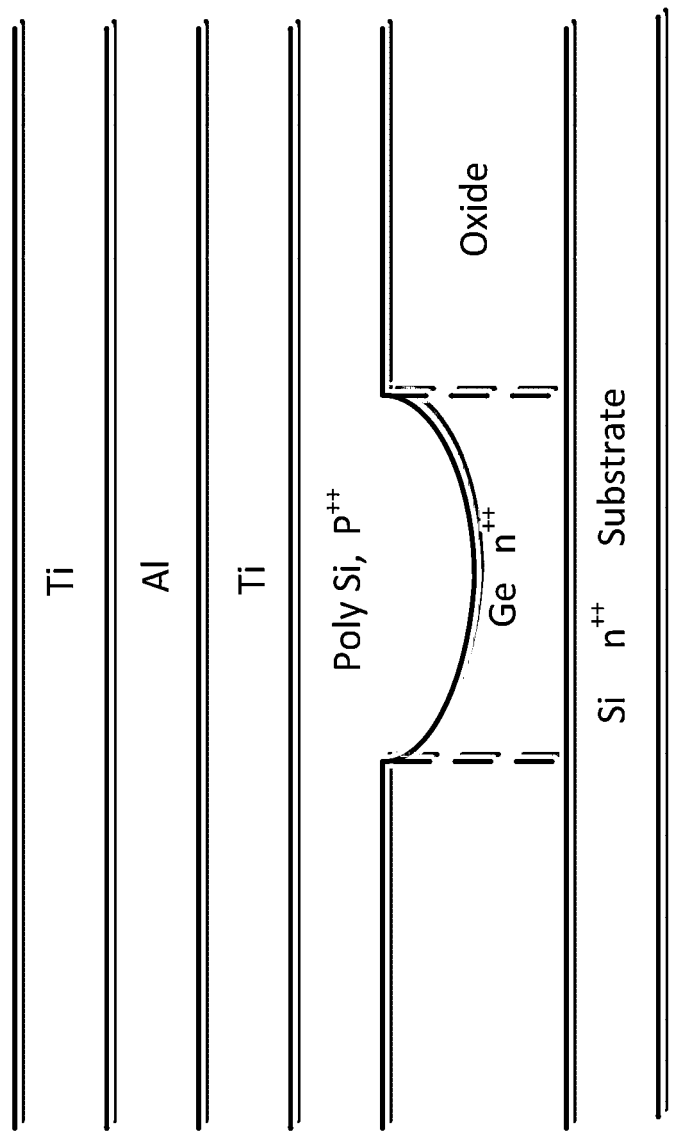
FIG. 1 shows the cross-sectional schematic of a Ge laser, in accordance with the prior art.

It should be appreciated that in accordance with the present invention, the figures describe hereinabove involve edge-emitting laser structures with resonant cavity configuration. Surface-emitting structures are also envisioned using disclosed active layers with appropriate spacer and quarter wave dielectric mirrors. The spacer and mirror layers are envisioned to be implemented using barrier materials and/or cladding materials. Distributed feedback (DFB) configurations in edge-emitting and vertical cavity surface emitting laser (VCSEL) are also envisioned using the active layer, cladding layers, and substrates disclosed in here.

The present invention includes light-emitting and lasing structures that use Ge, SiGe, Si, GaAsP, GaP, and other indirect gap semiconductors. Structures facilitating creation of excitonic transitions which yield higher internal quantum efficiency in generating photons are described. Excitons are envisioned in structures including: (1) two different layers that are either adjacent or separated by a thin barrier layer, where at least one layer confining electrons and holes is comprised of indirect gap semiconductor, and (2) where excitons formed by electrons in direct gap layer and holes in the indirect gap layers; where layers hosting electrons and holes are adjacent or separated by a thin barrier layer. In one embodiment, the light emitting devices may be configured as p-n junction and metal-oxide-semiconductor (MOS) field-effect structures. In another embodiment, laser structures incorporating quantum dot based active layers are described which result in enhanced optical gain and reduce the threshold current density. In still yet other embodiments, Nanoisland and nanointerface (nanodot-mediated) based fabrication methodology to obtain defect-minimized unstrained and strained quantum well/quantum dot active layers is described. Tensile strained in Ge quantum dot active layers having over 2% strain which uses II-VI layers in a double heterostructure configuration is also described.

In still yet another embodiment, lasing takes place in an active layer which includes $GeO_x$—Ge cladded dots that form a quantum dot superlattice (QDSL). The electrons and holes are injected from a p-n junction and/or a modified MOS interface into the active layer which includes $GeO_x$—Ge cladded dots. The QDSL thin barriers and dots result in ultra-narrow mini energy bands corresponding to indirect (L valley) and direct gap states (valley) of Ge. The injected minority carriers fill the indirect gap mini-band and overflow into mini-band corresponding to direct gap states (in valley), resulting in low threshold lasing transitions. Methods of fabricating various structures are described using dislocations and defects reduction nano-interfaces and patterned nano-islands on Si, Si-on-Insulator (SOI), and other substrates. The lasing devices are configured to be incorporated with other silicon nanophotonic devices, field-effect transistors, and integrated circuits.

In accordance with the present invention, various structures may be used to obtain lasing in active layers that include at least one layer of indirect gap semiconductors are described. Si, Si—SiGe, Ge and GaAsP:N/GaP based injection lasers are shown as examples. Some embodiments of the laser structures involve enhancing binding energy of excitons, resulting in higher quantum efficiency $\eta_q$ and optical gain in the wavelength region where transparency condition is met. The formation of direct excitons in active layers may include two layers, one confining hole in Ge or Si and the other confining electrons in direct gap layer, is used. In addition, an active layer having quantum dot superlattice formed by arrays of GeOx-cladded Ge dot is shown to form narrow mini-energy bands. Once the injected carriers have filled the conduction mini-band corresponding to the indirect gap states, carriers start filling the direct gap mini-band leading to lasing in Ge—GeOx quantum dot superlattice active layer. In other embodiment tensile strained Ge active layer, configured as including quantum dots, is described to implement lasing. Methods to fabricate quantum dot, quantum wire, and quantum well active layer based laser structure implemented on Si are also presented.

FIG. 1 shows and describes lasing taking place in a Ge layer in accordance with the prior art which is pumped so high that the injected electrons fill the conduction band states corresponding to indirect energy gap and transitions take place from the direct gap states to valence band states. However, the operating current densities are too high for this type of laser to be of integrated with Si nanophotonics and other devices.

Figure 2:
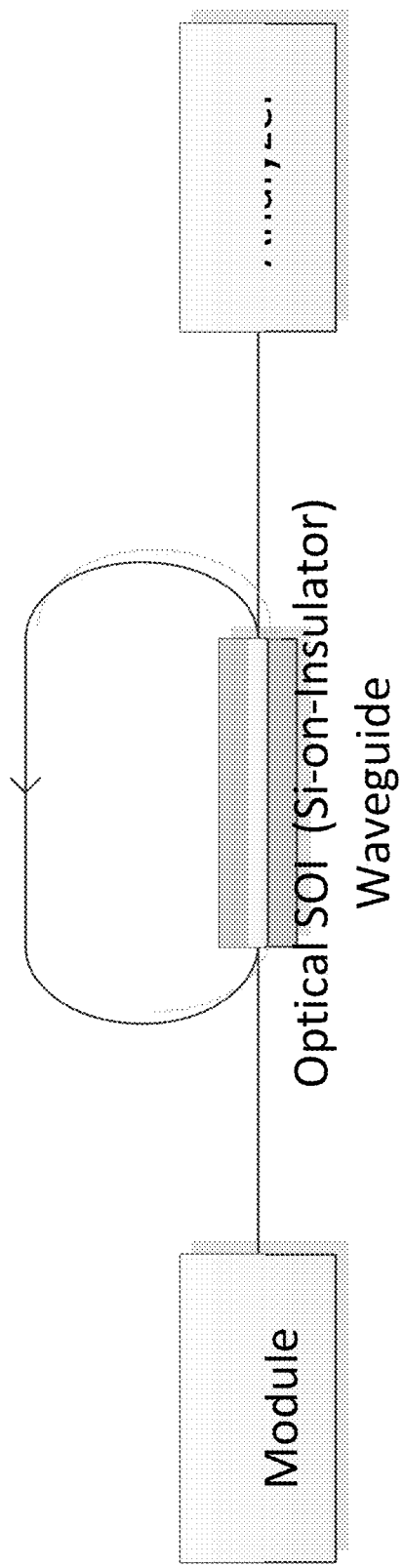
FIG. 2 shows schematically an Si laser, in accordance with the prior art.

FIG. 2 shows a schematic of an optically pumped Si Raman laser in accordance with the prior art where Si is used as a waveguide for below the gap light emission. A tapered Silicon-On-Insulator (SOI) rib waveguide with approximately 2 cm in length, with a low insertion loss, is used as a gain medium. A mode-locked fiber laser operating around 1540 nm is used as a pulsed pump laser. To prevent excessive spectral broadening and the pulse distortion in the Erbium Doped Fiber Amplifier (EDFA) and in the fiber patchcords (PC), the pulses are broadened to 30 ps in a spool of fiber (not shown) before amplification to the desired peak power. The Raman gain in the silicon waveguide produces lasing.

In accordance with an embodiment of the present invention, FIG. 3a shows a quantum well structure 1 using type-II Si—SiGe—SiGe system, which provides adequate band offsets for the confinement of electrons ($\Delta E_c$) and holes ($\Delta E_v$), respectively. The associated energy band diagram is shown in FIG. 3b. In addition, Table I hereinbelow lists some values of band offsets for various layers and interfaces. It should be appreciated that the layer compositions may vary depending on the structure. In the structure of FIG. 3a, the electrons reside in the Si well 30 (undoped or lightly doped) and holes reside in the $Si_{0.5}Ge_{0.5}$ well 4 (layer #4). Layer 30 is adjacent to layer 31 which serves as a barrier as well as part of waveguiding region. It has a higher band gap and lower index of refraction than layer 30. Layer 31 is deposited with layer 2 which serves as upper cladding (typical materials shown are n-ZnSSe and n-Si0.75Ge0.25. The well confining holes is formed by Si 30 and $Si_{0.75}Ge_{0.25}$ layer 5 barrier layer. Layer 5 is part of the waveguide region which is adjacent to lower cladding layer 61. The electrons are confined in Si well 30 by layer 31 (selected from ZnSSe/ZnS or $Si_{0.5}Ge_{0.5}$) on one side and $Si_{0.5}Ge_{0.5}$ layer 4 on the other. In this case the electrons being in layer 30 and holes in layer 4 are spatially displaced. This would result in the formation of spatially separated indirect excitons with lower binding energy, which will result in reduced optical gain. The structure is grown on a heavily doped p+ Si substrate 7. Layer 60 is realized using lattice matched ZnMgS, ZnS or graded ZnSSe layer. This layer also serves as the cladding. Layer 61 and 60 operate in cooperation. The upper cladding 2 interfaces with a cap layer 8 which facilitates in making low resistance Ohmic contact. The top contact stripe 10 is formed using a SiO2 mask layer 9. The bottom Ohmic contact is shown as 11. The associated energy band diagram is shown in FIG. 3b. Here, first bound electron level Ee1 is shown in the conduction band and hole level is shown Ehh1 and Elh1. Depending on the strain, light or heavy holes will be dominant in forming excitons with electrons in the adjacent well.

Figure 4A:
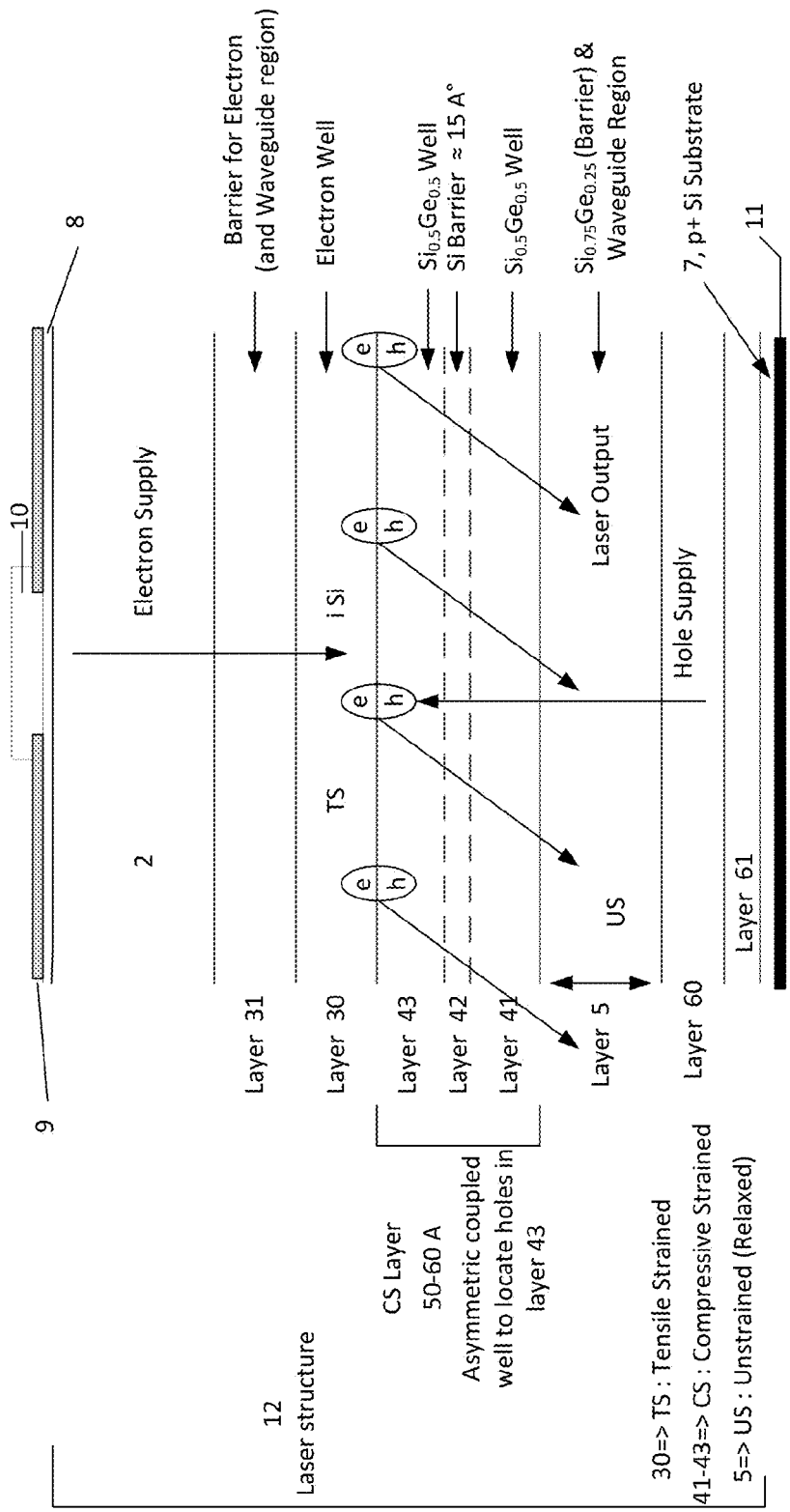
FIG. 4a shows an asymmetric coupled well in layer #4 of FIG. 1 to locate the hole near the layer #3a (which confines electrons), in accordance with an embodiment of the present invention.
Figure 4B:
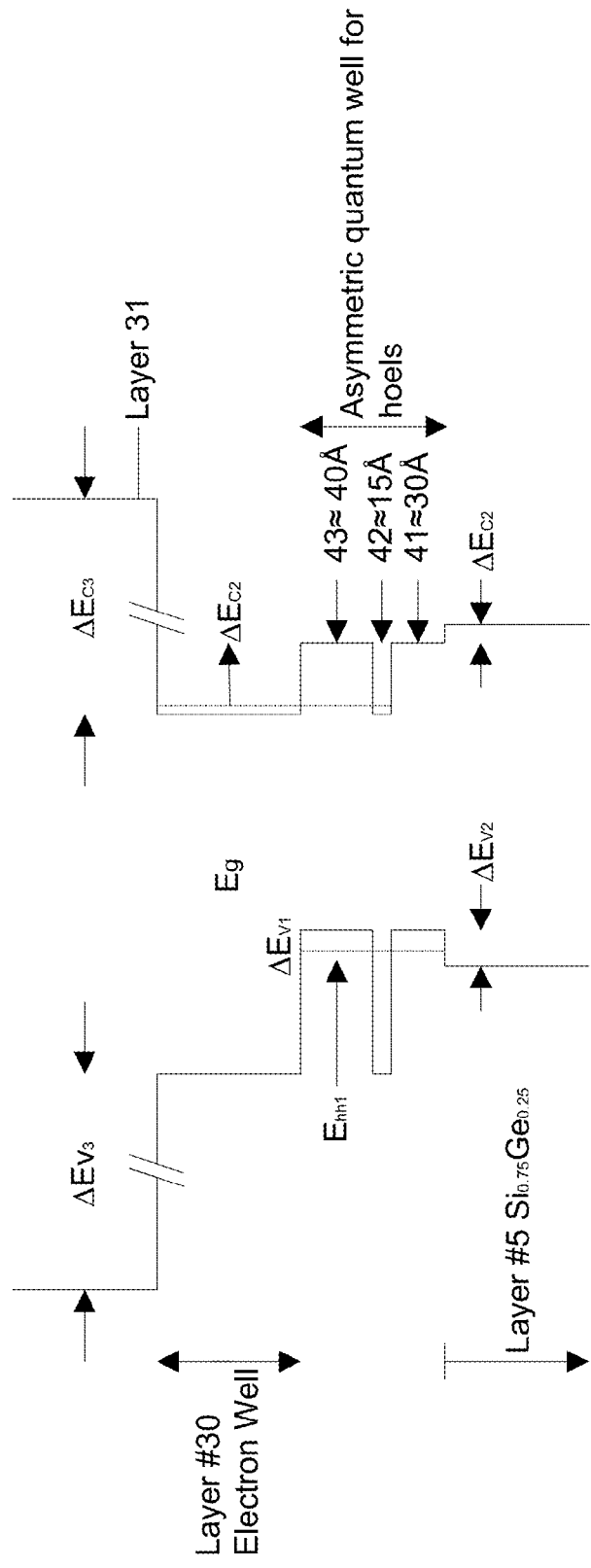
FIG. 4b shows an energy band diagram showing rectangular electron well and asymmetric coupled-well for holes (layer #4), in accordance with an embodiment of the present invention.

To further enhance exciton binding energy in the active layer, FIG. 4a shows the structure 12 which incorporates an asymmetric quantum well for confining holes in the valence band. Holes in layer 43 are now in more proximity to electrons in quantum well layer 30. That is, the $Si_{0.5}Ge_{0.5}$ quantum well layer 4 confining the holes is replaced by a coupled-well comprising of layers 41, 42, and 43. Here layer 42 is barrier, and 41 and 43 are quantum wells with different (asymmetric) width. The location of the Si barrier in the coupled well (layer #42) determines whether the holes are in the well (43) or the well (41). Other layers are similar to FIG. 3a and FIG. 3b. Table I below provides details about some various layers and their energy band gap energies. The energy band diagram is shown in FIG. 4b.

TABLE I

Energy Gap** & $\Delta E_v$ and $\Delta E_c$

| Layers # | Material | Band Gap (Bulk) | Between | Discontinuity $\Delta E_c$ | $\Delta E_v$ |
|---|---|---|---|---|---|
| 30 | Si | 1.04 eV* | Layers 30-43 | 0.15 | 0.3 = $\Delta Ev_1$ |
| 43 | $Si_{0.5}Ge_{0.5}$ | 0.89 eV | | $\Delta Ec_1$ | |
| 42 | Si | 1.04 eV | | | |
| 41 | $Si_{0.5}Ge_{0.5}$ | 0.89 eV | Layers 41-5 | $\Delta Ec_2$ | $\Delta E_{v2}$ |
| 5 | $Si_{0.75}Ge_{0.25}$ | 0.99 eV | | 0.01 | 0.09 |
| 31 | ZnSSe/ZnS | ≥2.67(ZnSSe)/3.8 | Layers 31-30 | $\Delta Ec_3$ | $\Delta Ev_3$ |
| 30 | Si | 1.04* | | ≥0.5-1.0 eV | |

*strain dependent,
**values depend on magnitude of strain.

Figure 5:
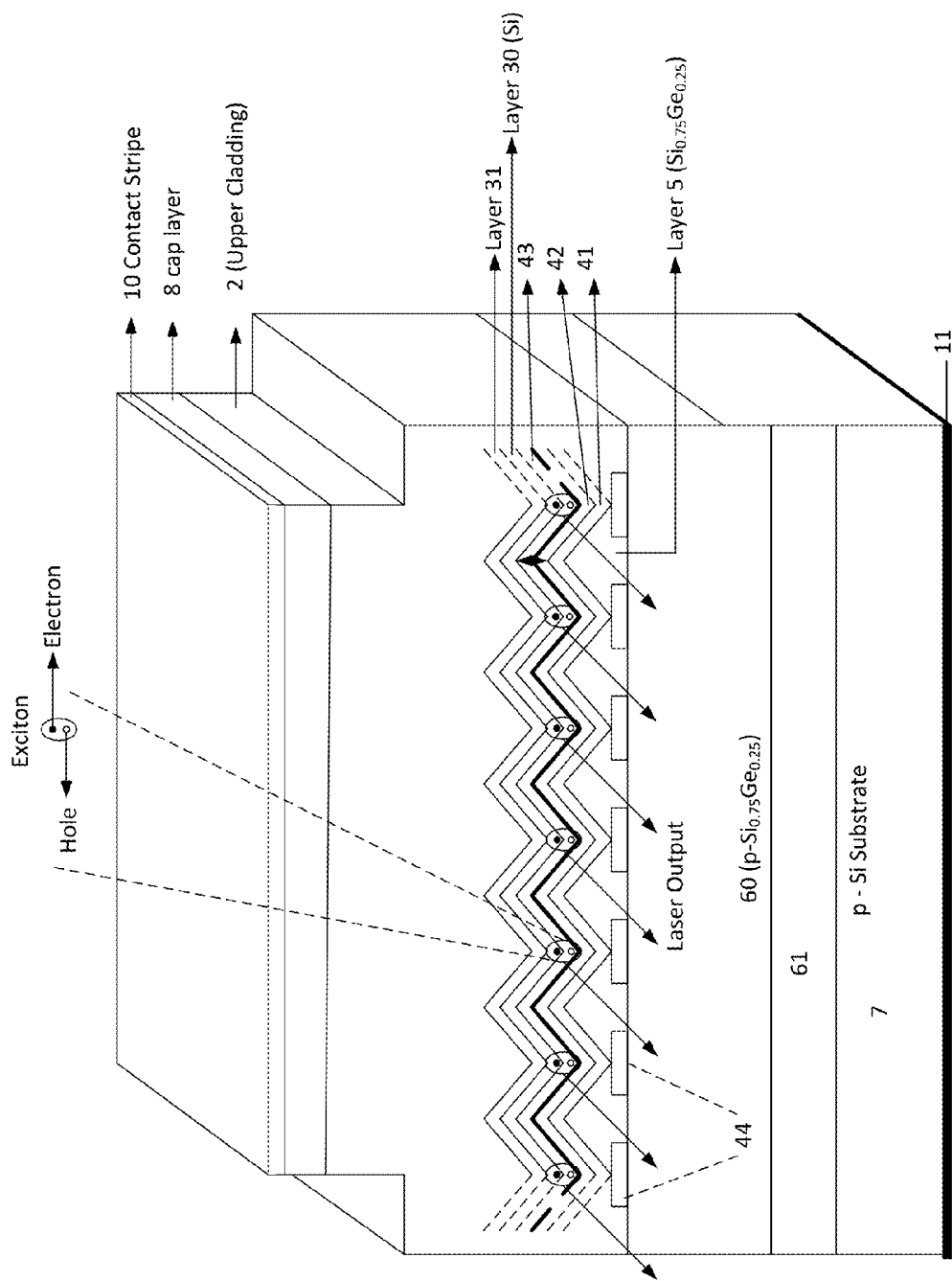
FIG. 5 shows a schematic cross-section of an index-guided stripe geometry laser having a Si/Si0.5Ge0.5 coupled well quantum wire laser using V-grooves via selective area epitaxy method, in accordance with an embodiment of the present invention.

FIG. 5 shows a quantum wire laser with a ridge waveguide configuration, where the quantum wires are implemented using selective area epitaxy. The growth of various layers seeds in nano-lanes between the $SiO_2$ patterns 44. It can also be achieved using epitaxial growth, patterning, and etching techniques. The active layer(s) (including two barrier layers) may be comprised of layers 31, 30, 43, 42, 41, and 5. The cladding layers are 2 and 60. Layer 61 is the buffer layer which could be II-VI or SiGe. The oxide mask layer 9 (like that in FIG. 4) for the top contact is not shown. Here the quantum wires are formed on top of lateral epitaxial region over $SiO2$ pattern. It should be appreciated that in other embodiments, quantum wires can be realized in the islands or narrow lanes between the $SiO2$ 44. Bottom contact layer 9 is also not shown. The binding energy of excitons for the laser of FIG. 5 will depend on the transverse thickness and lateral width of the quantum wire. The values are expected to be around 7-10 meV for 60×60 angstrom$^2$ cross-section wires. It should be appreciated that the excitonic binding energy may be enhanced by the usage of quantum dots, where the expected values may be in the range of 15-20 meV.

Figure 6:
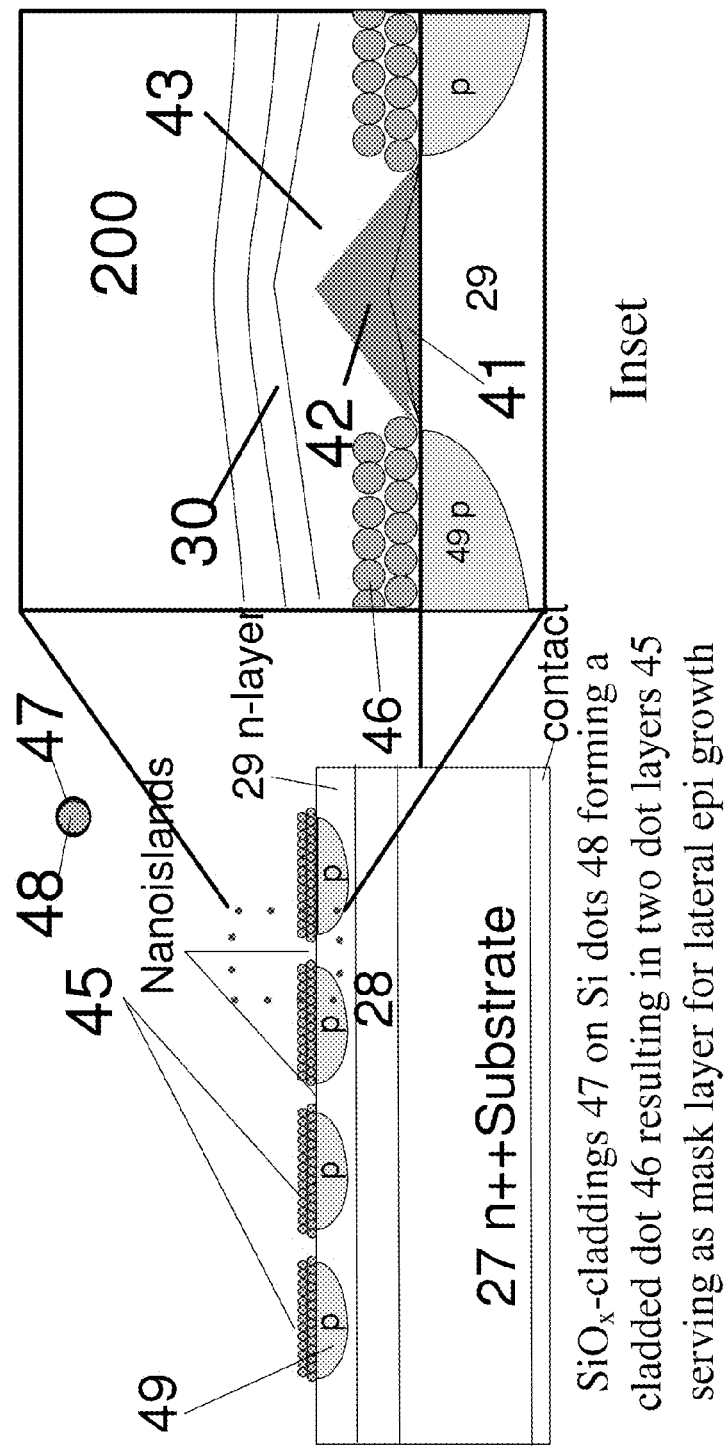
FIG. 6 shows a pseudomorphic SiGe—Si cladded quantum dot active layer where excitons are formed in quantum dots (this is different than FIG. 5 where quantum wires are shown), in accordance with an embodiment of the present invention.

FIG. 6 illustrates the schematic cross-section of a quantum dot array realized in nano-islands formed by using site-specific self-assembly of nanosilicon composite $Si/SiO_x$. Here, the SiO2 patterns shown as 44 in FIG. 5 are replaced by 45 which are formed by self-assembled SiOx-cladded Si quantum dots 46. These nanodots have thin SiOx cladding 47 and a Si core 48. Si nanodots are known to site-specifically self-assemble on p-doped semiconductor regions. Hence the regions on which SiOx—Si nanodots are assembled are shown as p-type 49. In one embodiment p-doped regions may be created by methods suitable to the desired end purpose, including ion implantation of p-type dopants on n-type layer 29 (analogous in composition Si0.75Ge0.25 to layer 5 in FIG. 5; with exception of doping). The nano-islands, in which quantum dots (shown in inset) are grown via layers 41, 42, and 4, where excitons form and lasing occurs, are formed inside regions 45 surrounded by SiOx—Si dots. That is, quantum dots are grown using selective area epitaxy and lateral epitaxial overgrowth. This is shown in the inset of FIG. 6. Layer 28 is analogous in composition to layer 60 (FIG. 5) with the exception that it is n-type. Similarly, the structure is grown on n++ substrate 27. The top cladding is 200 p+ Si. The bottom Ohmic contact layer is shown and the top cap layer and contact layers are not shown. The resultant laser can be implemented in edge-or surface-emitting structures.

Figure 7A:
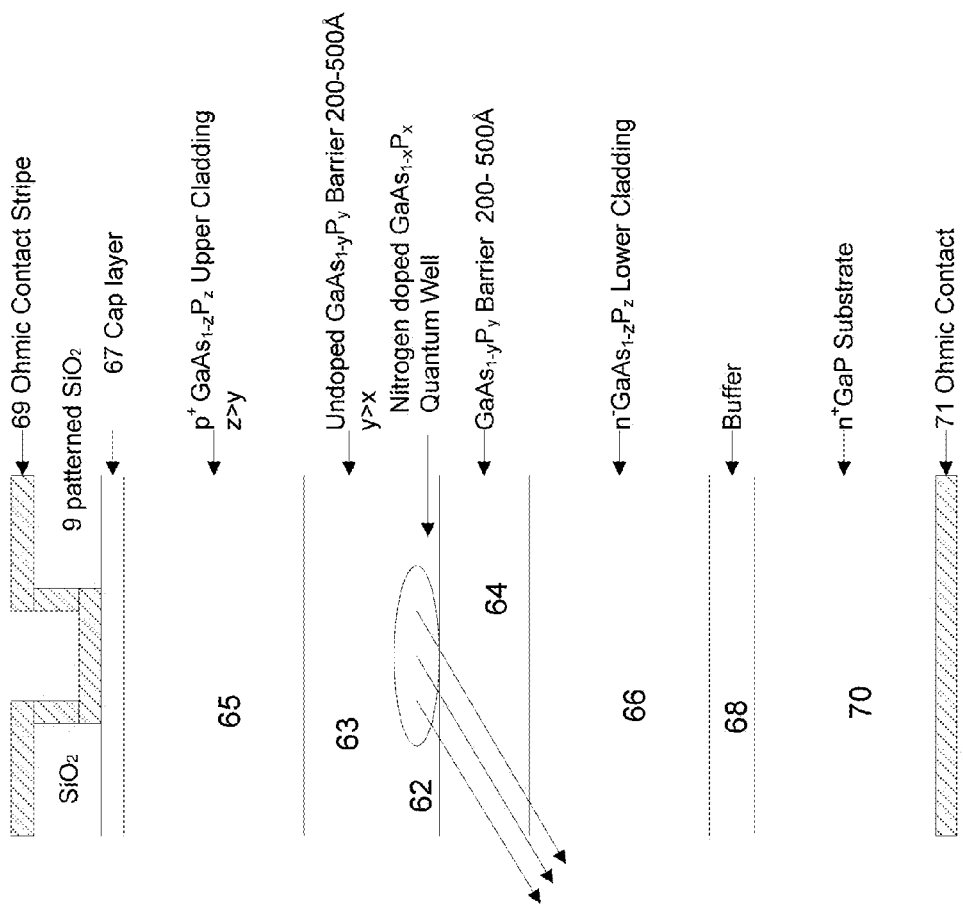
FIG. 7a shows a $GaAs_{1-x}P_x$:N (nitrogen doped) quantum well/wire/dot laser in edge-emitting configuration, where layers with different phosphorus concentrations may be used, such as 0.44<x<y<z. Bound exciton formation takes place at nitrogen (N) site after nitrogen doping, in accordance with an embodiment of the present invention.
Figure 7B:
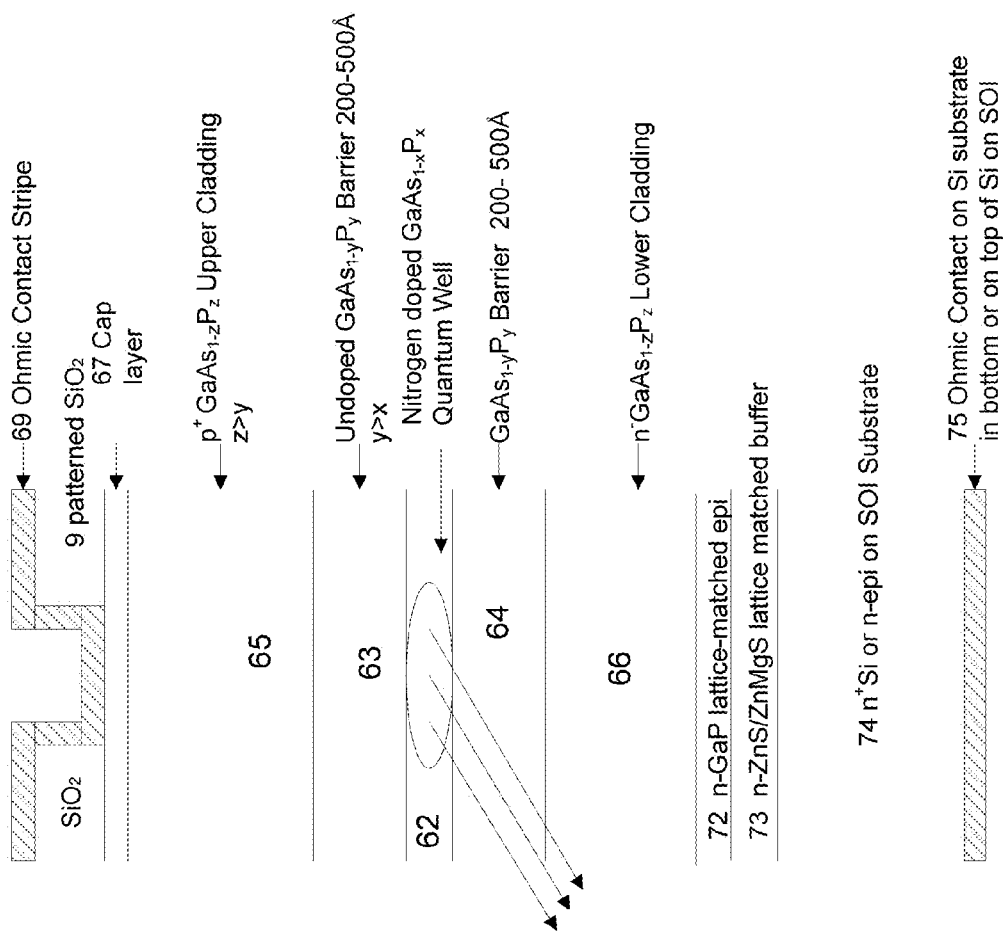
FIG. 7b shows a GaAsP:N active layer on Si substrate using II-VI buffer layer, in accordance with an embodiment of the present invention.

FIG. 7a shows a quantum well system in which the active layer is an indirect gap GaAsP layer doped with nitrogen 62. The quantum well is sandwiched between two barrier layers 63 and 64, which in turn are interfaced with upper cladding 65 and lower cladding 66. The substrate is n+GaP 70 with a thin buffer layer 68 implemented as GaP or ZnMgS. The bottom Ohmic contact is 71 and top Ohmic contact stripe is 69. The top contact is patterned using oxide layer 9 and is deposited on a cap layer 67 which offers lower resistance. Since GaP is lattice matched to Si, GaP layers can be grown on Si substrates 74 via ZnS or ZnMgS buffer layers 73 and 72 as shown in FIG. 7b. Other layers in the structure of FIG. 7b are similar as in FIG. 7a. In one embodiment, tensile strained active layers resulting in lower threshold current density can be realized by suitably choosing lower cladding compositions. The structures of FIG. 7a and FIG. 7b can be configured as quantum wire (like FIG. 5) or quantum dot (as FIG. 6) using selective area epitaxy or other fabrication techniques. One can also use the methodology described in FIG. 4 (where type-II heterointerfaces are employed to form excitons with higher binding energies) in case the band offsets are not adequate in a type-I hetero-interface.

Figure 8A:
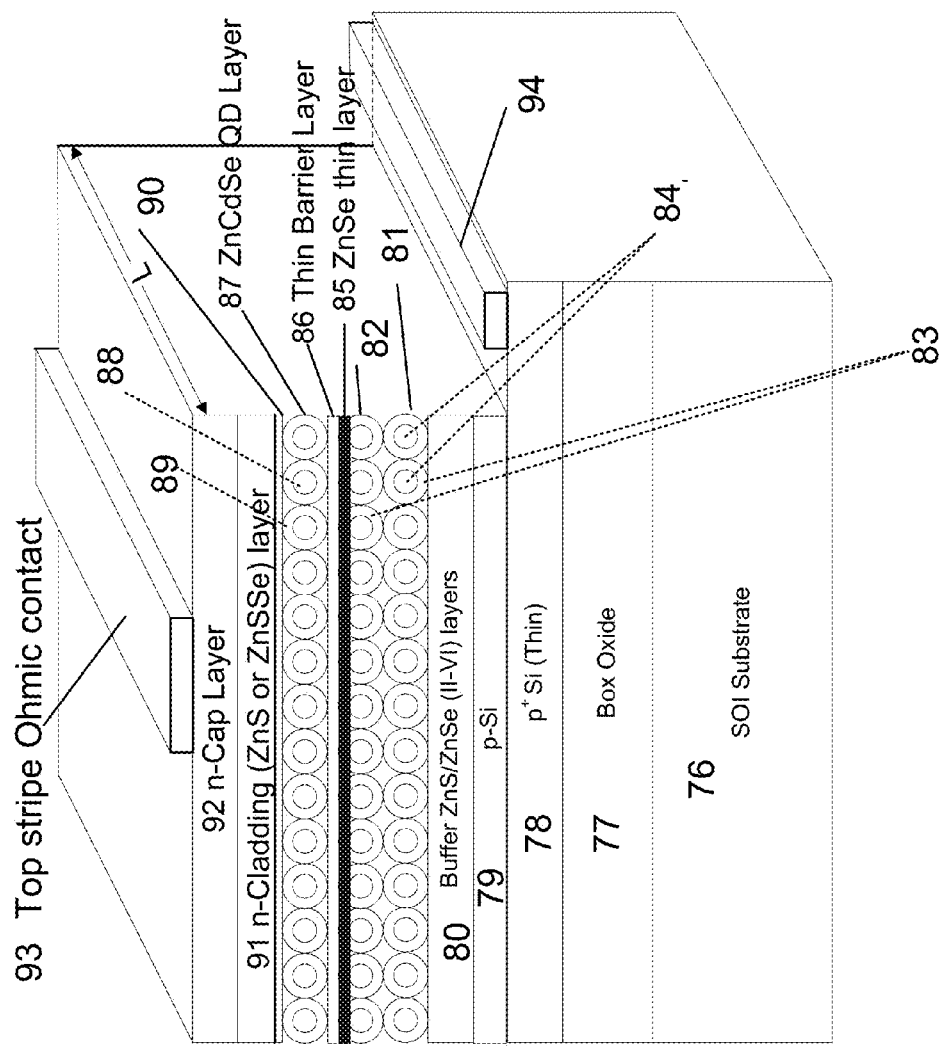
FIG. 8a shows $GeO_x$-cladded Ge quantum dots hosting holes and cladded ZnCdSe layer hosting electrons forming spatially separated excitons, in accordance with an embodiment of the present invention.

FIG. 8a shows a n-p junction laser structure in which excitons are formed in an active layer comprising of hole confining and electron confining quantum dots. The holes are confined in GeOx-cladded Ge quantum dots in layers 81 and 82 and electrons are confined in ZnCdSe-cladded CdSe quantum dots in layer 87 (with CdSe quantum dots 88 and ZnCdSe claddings 89). The top Ge quantum dot layer 82 has its GeOx cladding 83 partially removed exposing Ge dots 84. In one embodiment, this may enable deposition of a wider energy gap layer 85 (such as ZnSe or ZnSSe). This layer may serve as the barrier between holes in the Ge quantum dot layer and electrons confined in the ZnCdSe-cladded CdSe QD layer. In addition, a layer 86 comprised of ZnSSe or ZnMgSSe may be deposited and which may serve also as a barrier. Only one layer of GeOx—Ge quantum dot is envisioned in other embodiments (although more may be used as deised). The active layer comprising quantum dot layers and two barrier layers 90 (selected from n-ZnS, n-ZnSSe, n- ZnMgSSe on CdSe dot side) and 80 on Ge dot side. The barrier layers are interfaced with cladding layers 91 and 77. The cladding 77 has thin layers of p–Si 79 and p+Si 78 disposed as epitaxial layers. In one embodiment, layer 79 may serve as a self-assembly promoting layer for Ge quantum dot layers. The p+Si epi layer is in SOI configuration with SiO2 is 77 and handle wafer being 76. In another embodiment layer 79 may be thin, and Si epi layer 78 may be thin, and box oxide 77 may serve as the photon confining lower cladding layer. Upper cladding 91 has a low energy gap cap layer 92 with Ohmic contact 93. The Ohmic contact to bottom side is 94 on layer 78. In still yet another embodiment, the n-cladding layer 91 is thin and has a low index of refraction cladding layer implemented by SiO2. The Ohmic contact may be realized on a part of cladding extending on the side in a similar manner as contact from the bottom side 930. The laser cavity length L is shown. In this structure, electrons being in direct gap quantum dot layer 87 and holes in Ge quantum dot layer form direct excitons. This structure leads to lower threshold current density as the optical gain due to direct exciton transitions is higher (than structure of FIGS. 3-6).

Figure 8B:
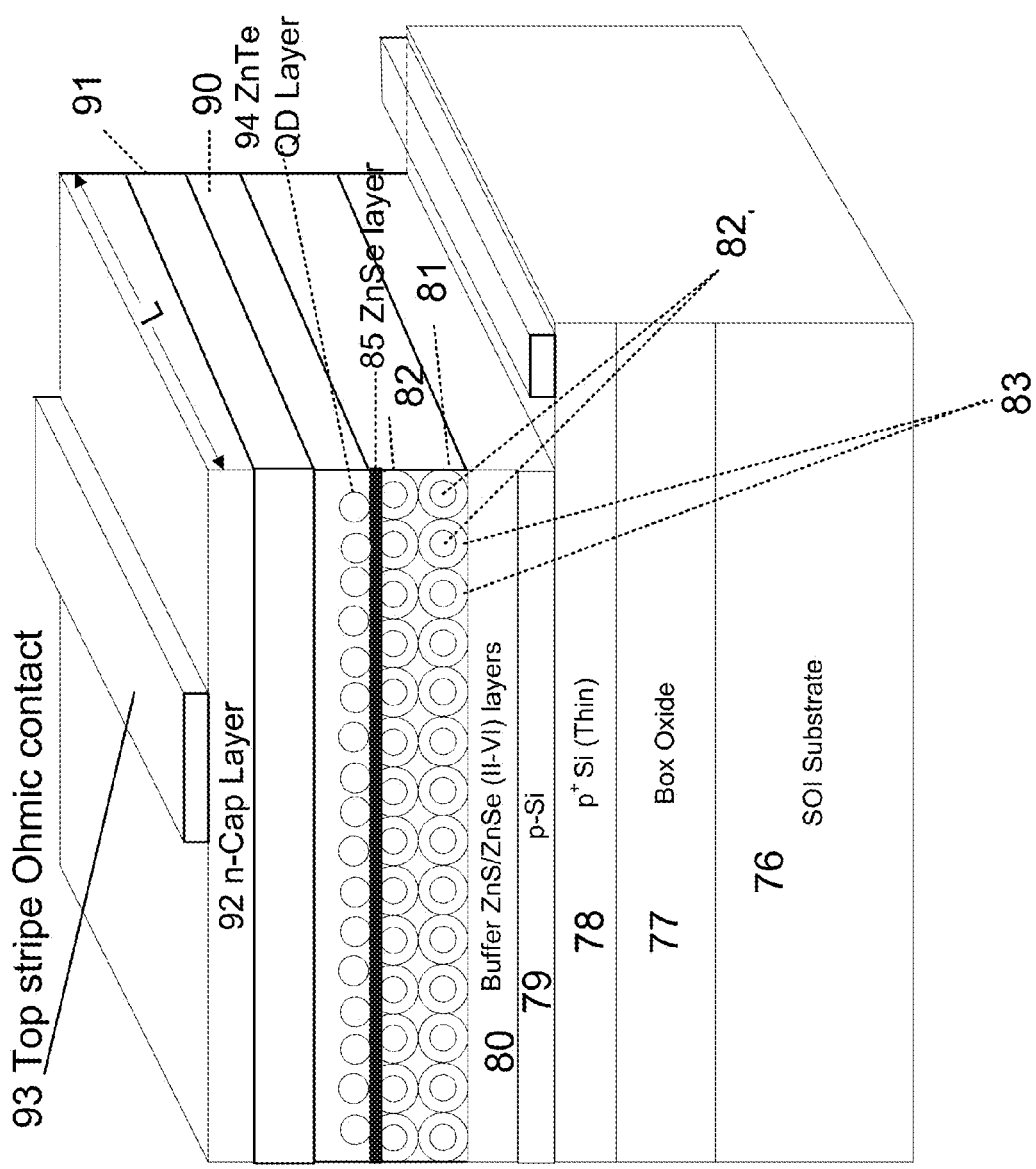
FIG. 8b shows Type II QD active layer with ZnTe dots and Ge dots separated by a thin barrier layer where electrons are confined in ZnTe quantum dots and holes confined in Ge quantum dots and where the two dot layers are adjacent with a barrier layer, in accordance with an embodiment of the present invention.

FIG. 8b shows an embodiment where the quantum dot layer which confines holes includes ZnTe dots 94. The Ge dot layers are similar to shown in the structure of FIG. 8a. In one embodiment, ZnTe quantum dots may be implemented using strained induced dot formation due to lattice mismatch between ZnSe layer 85 and layer 90 (selected from n-ZnS, n-ZnSSe, n-ZnMgSSe). The ZnTe quantum dot layer is separated by thin barrier layers 85 from top Ge—GeOx quantum dot layer 82. Electrons confined in ZnTe quantum dots and holes confined in Ge quantum dots. The two dot layers are adjacent with a very thin barrier layer 85. This results in the formation of direct excitions. Here the energy of lasing can be adjusted by the composition of dot material and the magnitudes of band offsets due to the formation of type II heterointerfaces. In this structure the electron affinity of ZnTe makes it possible to have electrons in its dots separated by a thin barrier forming excitons with high binding energy. Note that in this case, the electrons in ZnTe (direct gap) and holes in Ge (indirect gap) have the same k-or momentum point in the Brillouin zone, resulting in direct excitions with very high optical gain. The wavelength of emitting radiation can be tuned by the composition of ZnTe such as ZnCdTe and other II-VI combinations. In another embodiment, SiOx—Si quantum dots can be used in place of GeOx-Ge dots. However, in this case layer 85 will be selected from ZnS and ZnMgS which matches with Si.

Figure 9:
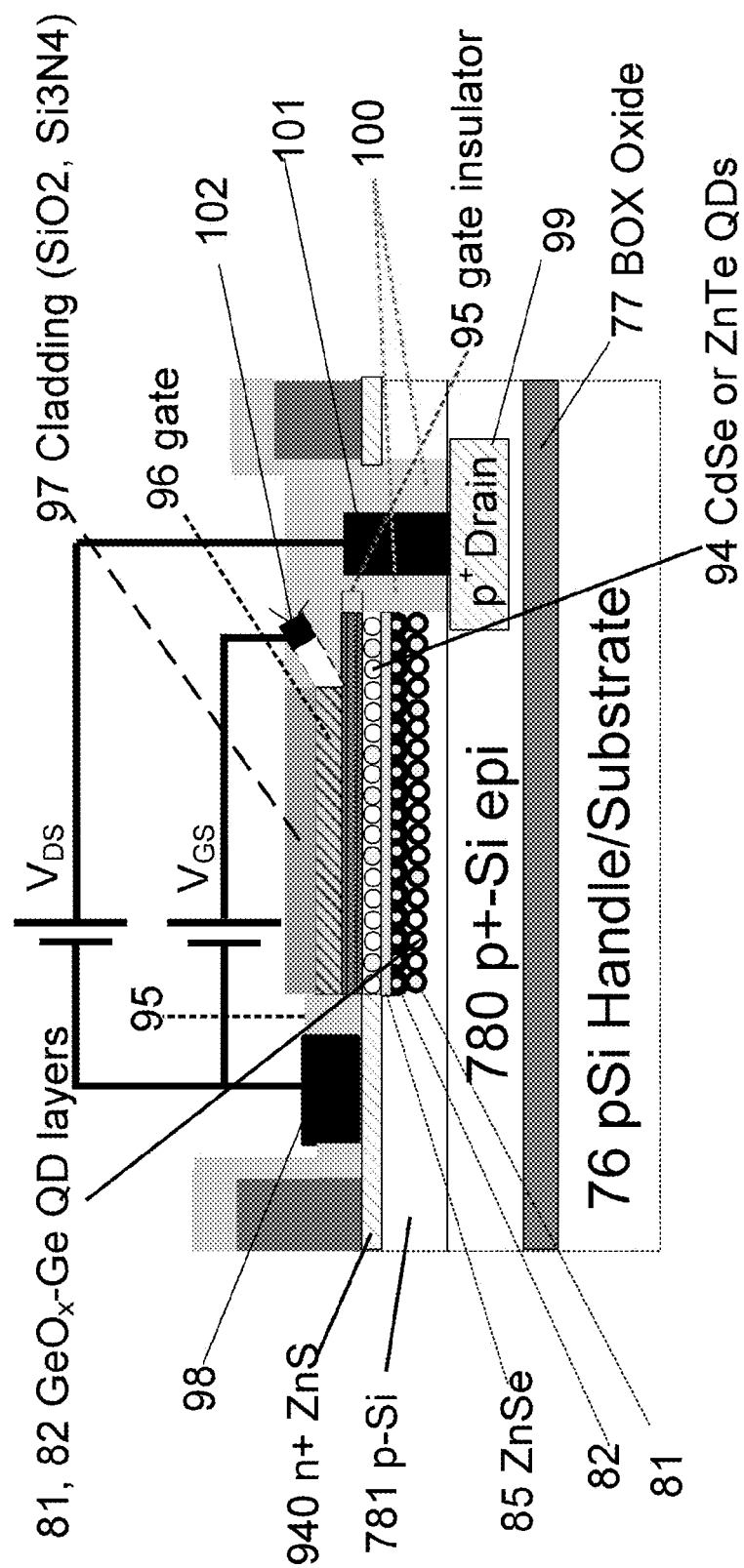
FIG. 9 shows a MOS FET structure with n-type source and p-type drain, where the electrons are confined in the inversion layer of CdSe dots when the gate voltage is above threshold with respect to source and the holes are provided by the p-Si epi with adequate doping when the drain is biased positively, in accordance with an embodiment of the present invention.

FIG. 9 shows a MOS-FET type structure. However, unlike conventional MOS-FETs, here there is an n-type source 940 and p-type drain 99. The inversion layer is realized in a quantum dot layer 94 where electrons are made available via source 940 when the gate-source biasing VGS results in above threshold condition. The holes are injected from drain 99, which is isolated from the inversion layer 870 by isolation region 100, into GeOx-cladded Ge dot layers 81 and 82. The Ge quantum dots are separated from ZnTe dots by a thin barrier layer 85. The ZnTe quantum dots are deposited with a stack (multiple layers of high energy band gap) 95 which also serves as the high-k gate insulator. The gate insulator has a first layer of ZnS or ZnMgS which assists in the formation of ZnTe based quantum dots (like layer 90 in FIG. 8b). Above the gate stack 95 there is the gate layer 96 which determines the threshold voltage. Gate 96 is selected from doped poly Si, poly Ge, poly Si—Ge, or metal TiN, TaN. The thin gate layer is deposited with a low index of refraction cladding 97. The gate length (channel length) determines the width of the laser structure and gate width determines the length of the laser cavity.

The cavity is formed by etching of smooth walls. The gate contact on the side is shown schematically as 102. The source and drain contacts are 98 and 101 respectively. The contacts are separated by insulating oxides such as 95 and 100. The cladded Ge dots are self-assembled on p–Si layer 781 which in turn is grown on p+ Si layer 780. Here, QD laser is configured with SiO2 box oxide 77 serving as the lower cladding and layer 97 as the upper cladding. The n-source supplies electrons to the top CdSe/ZnTe quantum dot layer (this layer could be of or similar to the type shown in FIG. 8a in one of many embodiments). The p–drain supplies holes via the p–Si epi contact to the Ge dots. The two dots are shown separated by a thin barrier 85. In this embodiment, the GeOx cladding is removed from the top Ge QD layer and a ZnSe thin layer is grown. This thin layer acts as a barrier and separates holes and electrons.

Here (like FIG. 8b), electrons are in a direct semiconductor quantum dot and holes are in the valence band of Ge (which is indirect semiconductor). However, both electrons and holes form direct excitons due to the k-wavevector being same in the Brillouin Zone. This would result in the formation of direct excitons with higher optical gain and lower threshold. The structure is compatible with Si FETs. Steps may be taken to modify 781 surface under 940 regions such that electrons from the n-source 940 are not injected into pSi epi layer 781, bypassing the gate controlled injection. In addition, in this structure, the drain is p–type and is separated from the inversion layer by an insulating region. The contact to pSi could be done by ion implant. Various embodiments of this structure are contemplated and envisioned. In one of the embodiments, quantum dot layer 94 is replaced by an amorphous p–Si (or p–Si:H) layer with gate insulator 95 being HfO2. In this embodiment, there is no need of stripping GeOx cladding in part from top quantum dot layer of GeOx—Ge. That is layer 85 is not needed. In addition, n+ source is realized in amorphous Si, and its contact can be realized directly on this layer. Gate layer 96 may be selected from poly Si, poly Ge or metals. The cladding would remain similar.

In another embodiment, the lateral confinement could be realized using photonic band gap (PBG) structure. The laser cavity this could be conventional or PBG. PBG structures will make the device compact and useful for optical transmission and processing on chip. This permits integration of light-emitting sources, optical modulators, and FET-based electronic circuits.

Figure 10A:
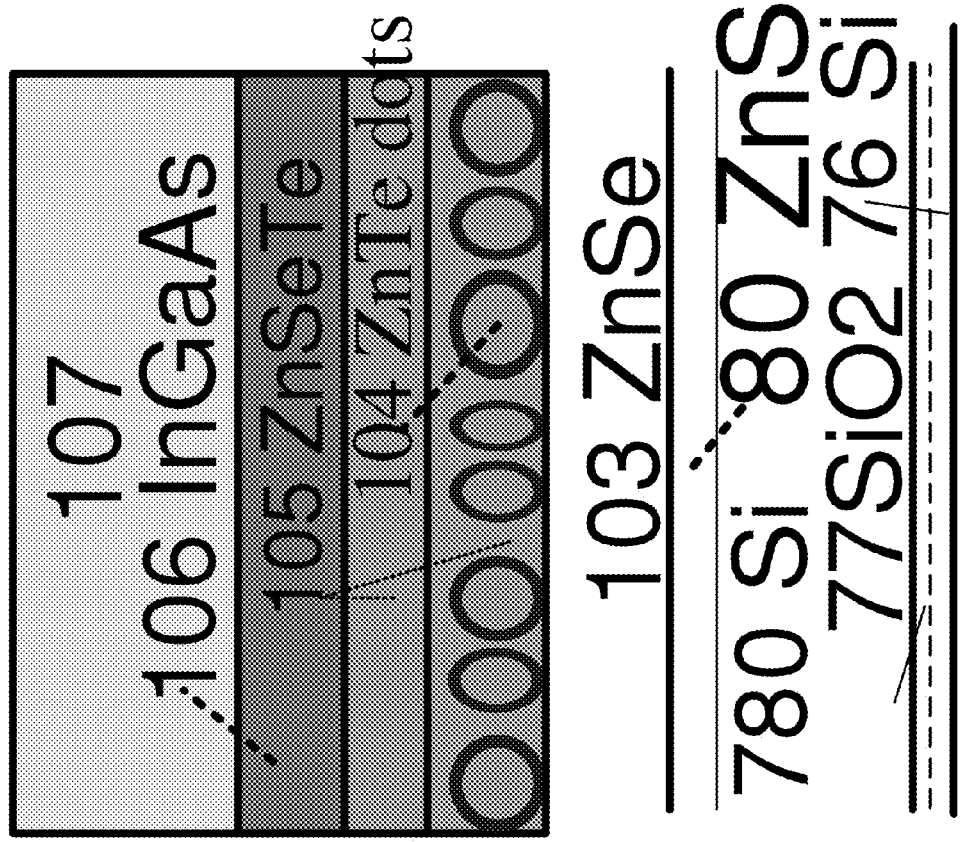
FIG. 10a shows schematically how an epitaxial InGaAs layer is grown on Si epi (in turn grown as Si-On-Insulator SOI) using ZnTe quantum dot mediated nano-interface, in accordance with an embodiment of the present invention.

FIG. 10a shows schematically how an epitaxial ZnCdTe or InGaAs layer 105 is grown on Si substrate 76 or epi layer 780 (as Si-on-Insulator 77 in SOI). The nearly lattice matched layer 80 (selected from ZnS or ZnMgS) is grown on Si epi layer 780. A thin ZnSe 103 is grown, followed by deposition of ZnTe which results in ZnTe quantum dots 104. Growth of ZnSeTe over ZnTe with heat treatment results in defect minimized films of ZnSeTe shown as 105. Part of ZnSeTe is in between the nanodots and other part is nucleated on it. Nanodot-mediated ZnSeTe layers 105 is a good starting point to lattice matched or strained thin layers 106 of InGaAs or Ge. The barrier layer 107 can now be grown along with subsequent cladding and cap layers (not shown here).

Figure 10B:
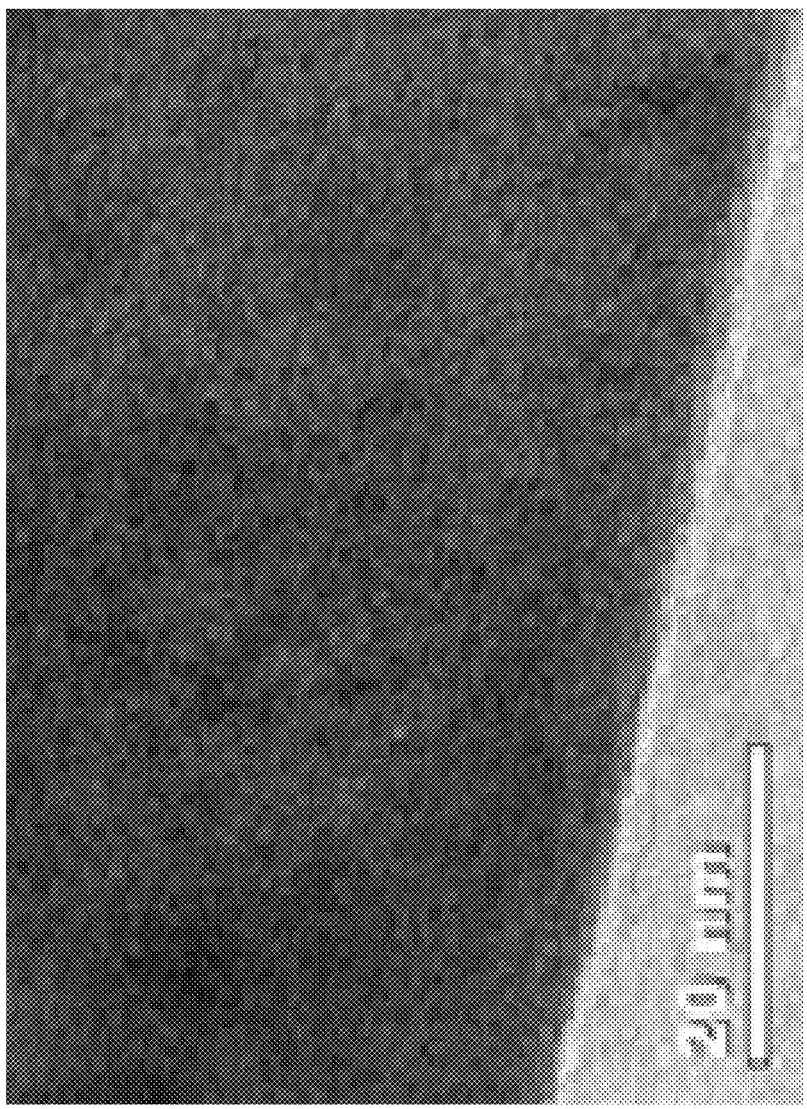
FIG. 10b shows a TEM cross-section, in accordance with an embodiment of the present invention.
Figure 10C:
FIG. 10c shows the electron diffraction pattern showing single crystal morphology, in accordance with an embodiment of the present invention.

FIG. 10b is a TEM cross-section and FIG. 10c is the electron diffraction pattern showing single crystal morphology. The Si industry roadmap envisions InGaAs-on-Si circuits taking advantage of much higher mobility in InGaAs quantum well channels. As an example, we present using nanodot-mediated epitaxy on Si producing low-dislocation density epitaxial layers. This would provide similar laser quality InGaAs single crystalline films on Si that can be used for lasers and improved performance Ge, InGaAs FETs on Si.

Method of Fabrication of Nanointerface for InGaAs Epi: In one embodiment, after native SiO2 layer desorption or etching on Si surface, very thin buffer layers of ZnS and/or ZnSe are grown at relatively low temperatures (360° C.) in metalorganic chemical vapor deposition (MOCVD) reactors with or without ultraviolet (UV) irradiation using (DES and DMSe, DES for ZnS) and DMZn) alkyl sources. This is followed by a ZnTe layer which is highly mismatched and results in the formation of quantum or nanodots. Since these dots are of different sizes and shapes, ZnSeTe layer is grown in between the dots and over them. This layer is annealed to glide dislocations. The sample is now ready for lattice matched ZnCdTe, InGaAs, and other thin epitaxial layer. The InGaAs layer would have over it a low index of refraction and higher energy gap cladding layer (such as II-VI layer) which results in overall reduced dislocation density in the structure. FIG. 11c shows the nucleation of tensile strained Ge dots over a ZnSeTe layer.

Figure 11A:
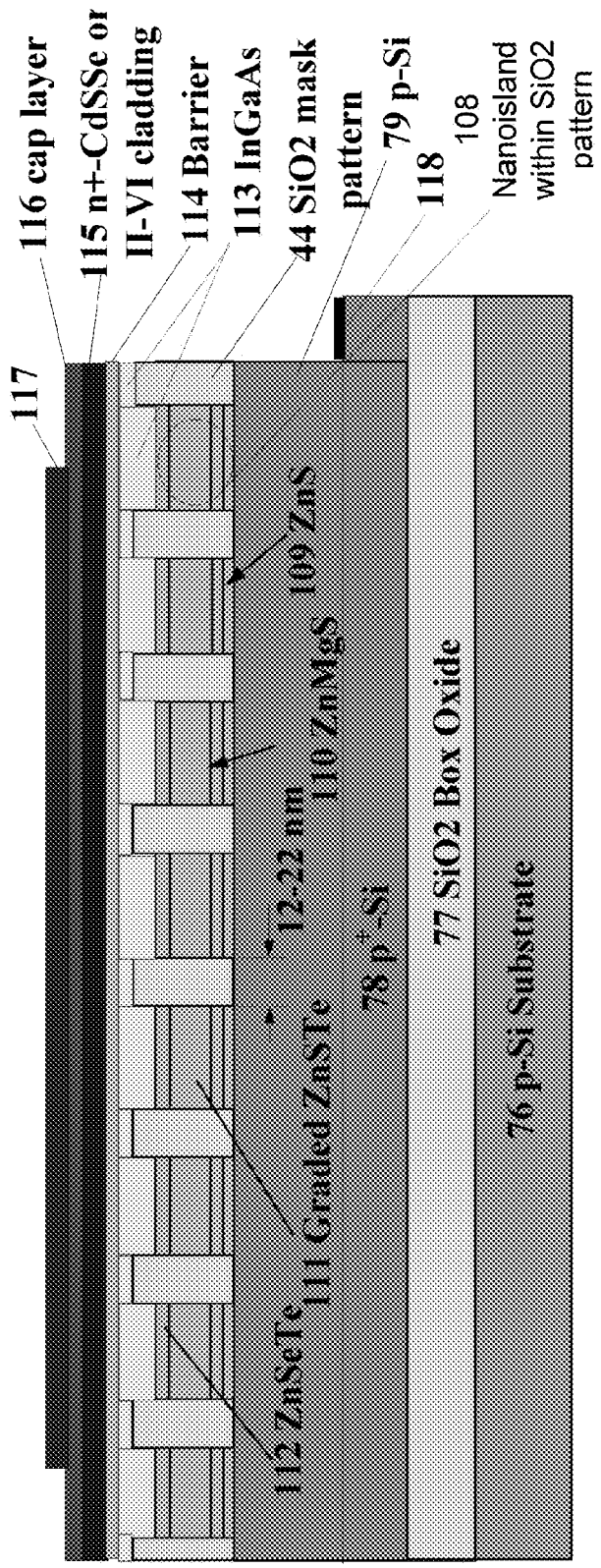
FIG. 11a shows growth of InGaAs in nanoislands created by $SiO_2$ masking layer and II-VI layers on Si epitaxial film in the regions created by patterned $SiO_2$, in accordance with an embodiment of the present invention.
Figure 11B:
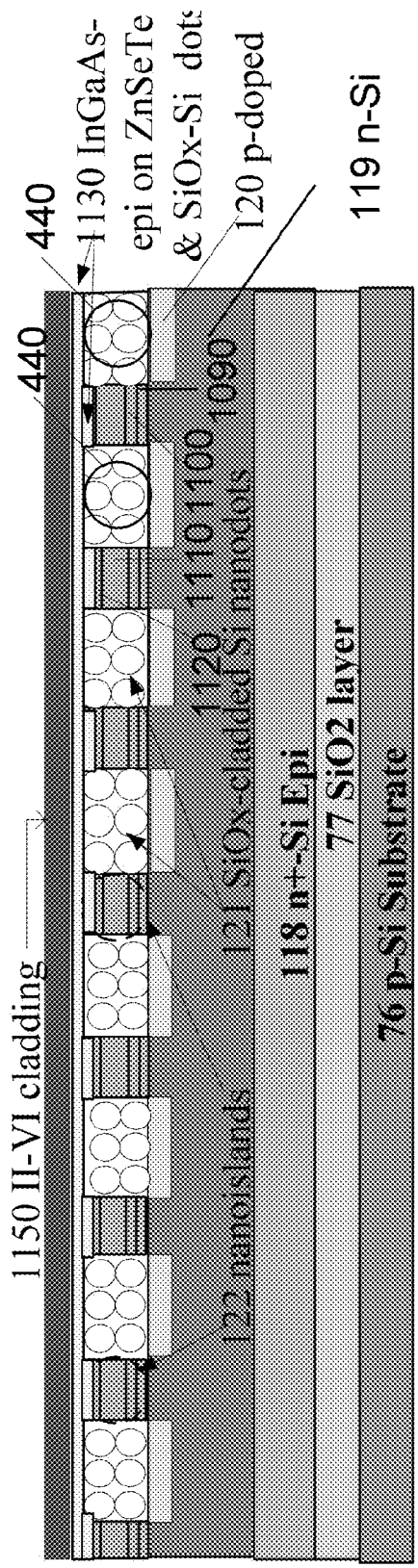
FIG. 11b shows growth of InGaAs in nanoislands created by $SiO_x$—Si nanodot masking layer using cladded SiOx—Si dots self-assembled on p-Si regions on Si epitaxial film, where the InGaAs layer may be grown on ZnSeTe top layer in the 8-10 nm nanoisland regions and where these regions may have dislocation reduction due to gliding and where the InGaAs layer may be in quantum dot form or quantum well configuration (II-VI stack is similar to FIG. 11a), in accordance with an embodiment of the present invention.
Figure 11C:
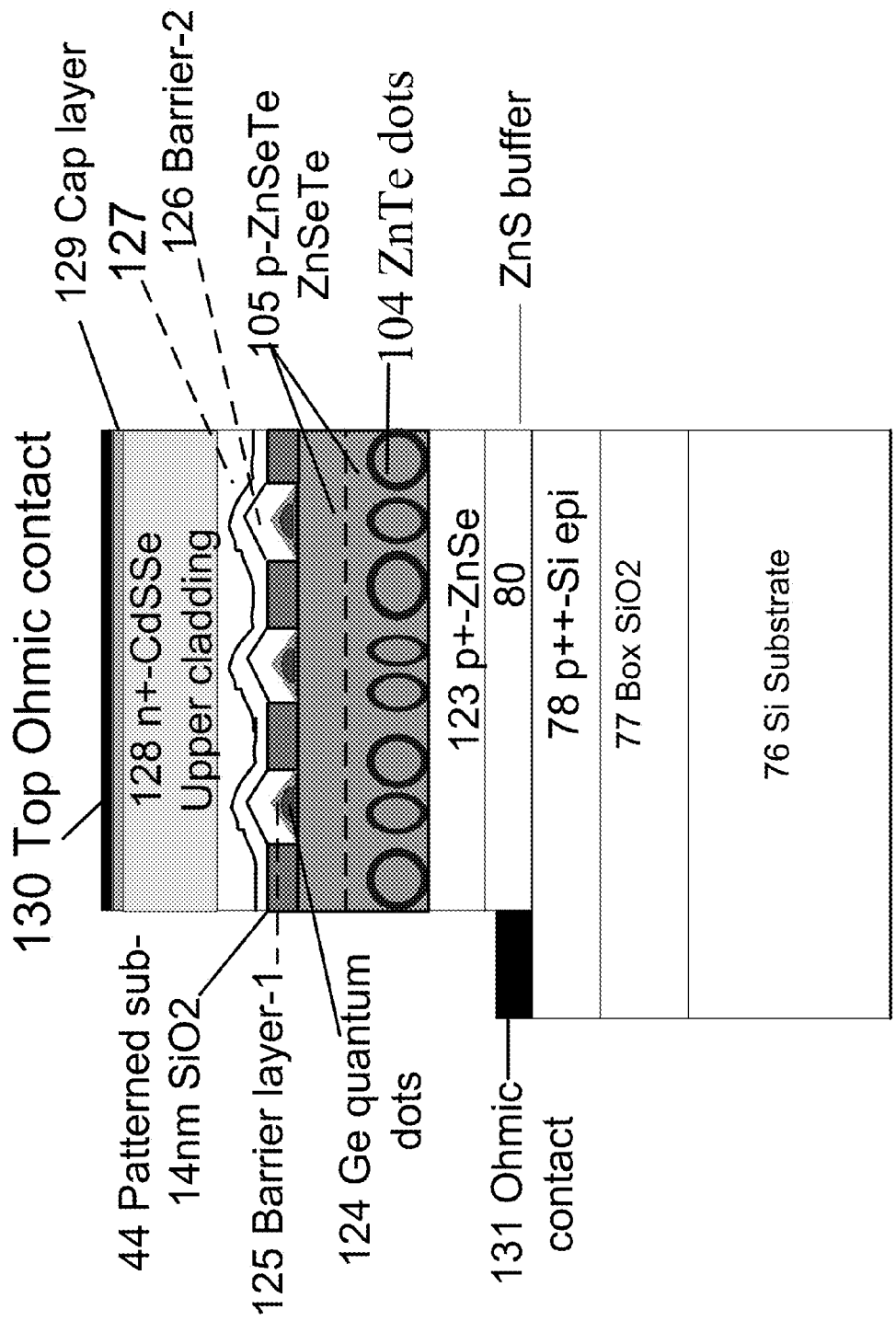
FIG. 11c shows nucleation of tensile strained Ge dots in patterned nano-islands surrounded by $SiO_2$ regions and SiO2-cladded Si nanodot regions, in accordance with an embodiment of the present invention.

FIG. 11a, FIG. 11b and FIG. 11c shows a method to fabricate laser structures on Si using active layers comprised of indirect gap, direct-indirect gap combination, and/or strained direct gap material quantum dots. Two approaches of defect minimized quantum well/quantum dot layer growth, using patterned nanoislands surrounded by SiO2 masking layer (FIG. 11a) and SiOx-cladded-Si nanodot mask layer site specifically self-assembled (FIG. 11b), are shown. A combination of nanoisland and nanodot mediated quantum dot growth is shown in FIG. 11c. Si on insulator substrates are taken as the starting material. FIG. 11a shows the nucleation and growth of InGaAs or other quantum well layers in nanoislands 108 created by SiO$_2$ masking layer 44 using various II-VI layers on Si epitaxial film 79. In one embodiment, II-VI layers 109 ZnS, 110 ZnMgS, 111 ZnSTe, and 112 ZnSeTe (with composition compatible with desired InGaAs quantum well 113 and designed strain) are epitaxially grown in the regions 108 surrounded by SiO$_2$. The InGaAs quantum well is deposited with barrier layer 114 (selected from InGaAsP, ZnSeTe) and cladding layer 115 (higher band gap n+ InGaAsP, II-VI layer CdSSe). The n+Cap 116 is grown next with Ohmic contact stripe 117. The bottom contact is 118 on p+−Si 78. In one embodiment, Si layers 78 and 79 are thin and box oxide 77 serves as the lower optical cladding. Growth in nanoislands or patterned films results in reduced dislocations upon post patterned annealing. In another embodiment II-VI layers are first grown, followed by SiO2 deposition and patterning. After the growth in nanoislands surrounded by SiO2, the layers are annealed to remove misfit dislocations which glide into the side walls of SiO$_2$. In yet another embodiment, the InGaAs layer is grown only in the nanoislands having II-VI epilayers to form quantum dots. Once the quantum dots are formed upper cladding can be realized using layers selected from II-VI (CdSSe) and III-V (InGaAsP).

FIG. 11b shows another embodiment of a method to grow InGaAs, Ge and other semiconductor structures on Si thin films using selective area epitaxy in nanoislands created by SiOx—Si nanodot masking layer via cladded SiOx-Si dots self-assembled on p-Si regions (on Si epitaxial film). Here, SiO2 patterns 44 of FIG. 11a are replaced by nanopatterns 440 formed by the self-assembly of SiOx—Si nanodot layers 121. Lateral encroachment via selective p-doping in regions 120 followed by rapid thermal annealing has shown to result in below the lithographic feature size patterns 122. InGaAs, Ge and other semiconducting quantum dots structures can be realized using this method of patterning and selective area epitaxy. Sub-10 nm nanoislands will yield 5-8 nm quantum dots. The formation of SiOx-Si patterns is also shown in FIG. 6. Various II-VI layers on Si epitaxial film 119 are grown.

In one embodiment, II-VI layers 1090 ZnS, 1100 ZnMgS, 1110 ZnSTe, and 1120 ZnSeTe or CdSSe (with composition compatible with desired InGaAs quantum well 1130 and designed strain) are epitaxially grown in the regions 122 surrounded by SiOx—Si regions 440. This is similar to FIG. 11a with the difference that the doping of II-VI layers is n-type or undoped as the Si layer 119 is n-type. The InGaAs quantum dot layer 1130 is grown on ZnSeTe top layer 1120 in the 8-10 nm nanoisland regions. The II-VI epi growth in nanopatterned regions will reduce dislocation density due to gliding of misfit dislocation during post patterning heat treatment. InGaAs quantum dots sandwiched between barrier layers may be formed inside the islands (like method used in FIG. 6) or over the II-VI layers as shown. The topology of InGaAs and subsequent layers may not be planar. Reference is made to FIG. 5 where V-shaped layers are grown via lateral epitaxial overgrowth (LEO) in patterned regions. In another embodiment, inverted V-shape layers like that in FIG. 6 and FIG. 11c would be grown. However, unlike that in FIG. 11b, here the detailed barrier, cap and contact layers are not shown. This method is envisioned to realize cladded quantum dot in a nanoislands surrounded by SiO2 or SiOx—Si nanodot region. Here the cladding may be a common layer to all quantum dots in the nanoislands.

FIG. 11c shows a tensile strained Ge quantum dot active layer based laser structure on Si substrates. Here, Ge dots 124 are grown on ZnSeTe layer 105 (which has much higher band gap and much larger lattice constant than Ge). The Ge dots will be tensile strained. An appropriate tensile strain Ge is known to theoretically produce direct band gap relative to unstrained Ge. ZnSeTe layers can also be formed in nanoislands like in FIG. 11b. However, here the nanodot-mediated approach is utilized (for detail description, see write-up for FIG. 10a). The layers over the Ge dots are of increasing energy gap 125 (such as ZnCdSe), 126 (ZnCdSSe) which serve as barrier layers. Layer 127 is a part of cladding layer 128. It may have the same (or similar) composition but slightly lower doping than n+ 128. The nucleation of Ge dots takes place in nano-islands created in between SiO2 regions 44 on ZnSeTe layer 105. Layer 105 is in turn grown on Si epitaxial layer 80 via very thin 123, 104 dots using technique described in FIG. 10a. The Ge dots are tensile strained. The magnitude of strain is determined by the composition of ZnSeTe and ZnCdSSe. When the strain is above a certain value (~3%), the Ge dot transitions are dominantly direct type. The structure also shows cap layer 129, and Ohmic contacts 130 and 131. Here, SOI or regular Si substrates can be used. Since the nano-islands surrounded by SiO$_2$ are of about 14 nm×14 nm dimensions, the dots of Ge nucleated should be smaller than the island dimensions. Here, selective area epitaxy of Ge and II-VI are envisioned to grow dots and surrounding barrier layers. The barrier layers get planarized as they get thicker. In one embodiment SiO2 mask 44 may be replaced by SiOx—Si nanodot mask regions 440 as shown in FIG. 11b.

Figure 12A:
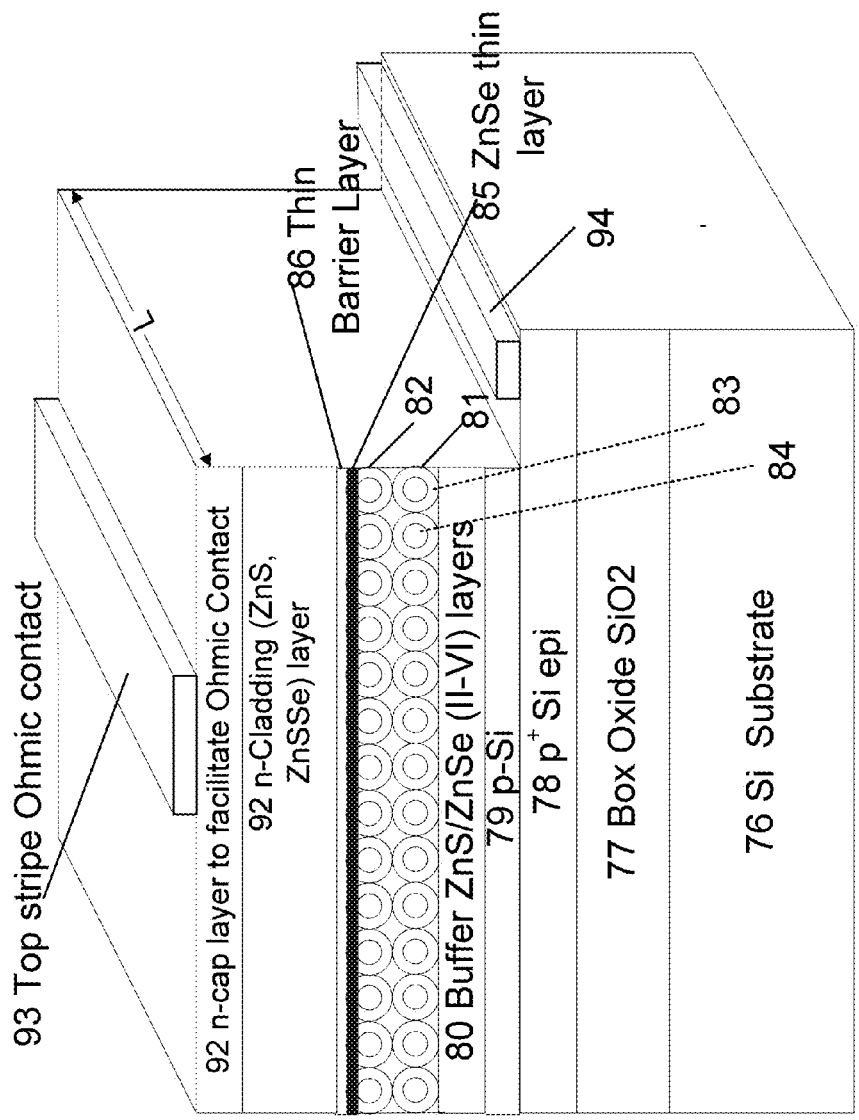
FIG. 12a illustrates electrically-pumped p-n junction, using Ge QDSL as n-layer, configured as a laser diode where lasing takes place via transitions involving ultra-narrow miniband in the conduction band corresponding to direct gap, in accordance with an embodiment of the present invention.

FIG. 12a shows an electrically-pumped active layer comprising of GeOx—Ge cladded dots forming a quantum dot superlattice (QDSL). Ge QDSL is configured as a laser diode in which lasing transitions occur via direct gap mini-bands at injection levels where narrow mini-band corresponding to the indirect gap states is filled. Here, lasing takes place in GeOx—Ge quantum dot superlattice (QDSL) active layer shown as layers 81 and 82. The GeOx cladding 83 is thin ~1 nm and the Ge quantum dot core 84 is ~3-6 nm. The Ge dots are self-assembled on p-Si layer 79. Layer 79 may have a thin barrier layer shown as 80. This layer may be selected from ZnS, ZnMgS, ZnSe or other suitable material. It may comprise one or more thin barrier layers such as ZnS and ZnSe. Layer 79 is deposited on 78 p+Si layer which is epitaxially grown on Si substrate or Si-on-insulator substrate (as shown). Here, 76 is the substrate or handle wafer and 77 is box oxide. In one embodiment, upper cladding 92 is selected from lower index and high energy gap layers which are compatible with barrier layers 86 and 85. The electrons are injected from n-side cladding 92 which is heavily doped. Holes are injected from p+-side layer 78. In another embodiment, layer 77 serves as lower cladding. In other embodiments, layer 78 serves as a cladding when it has lower index of refraction than Ge and band gap such that it injects holes. GaP, GaAsP based cladding and hole injectors are contemplated and envisioned.

Figure 12B:
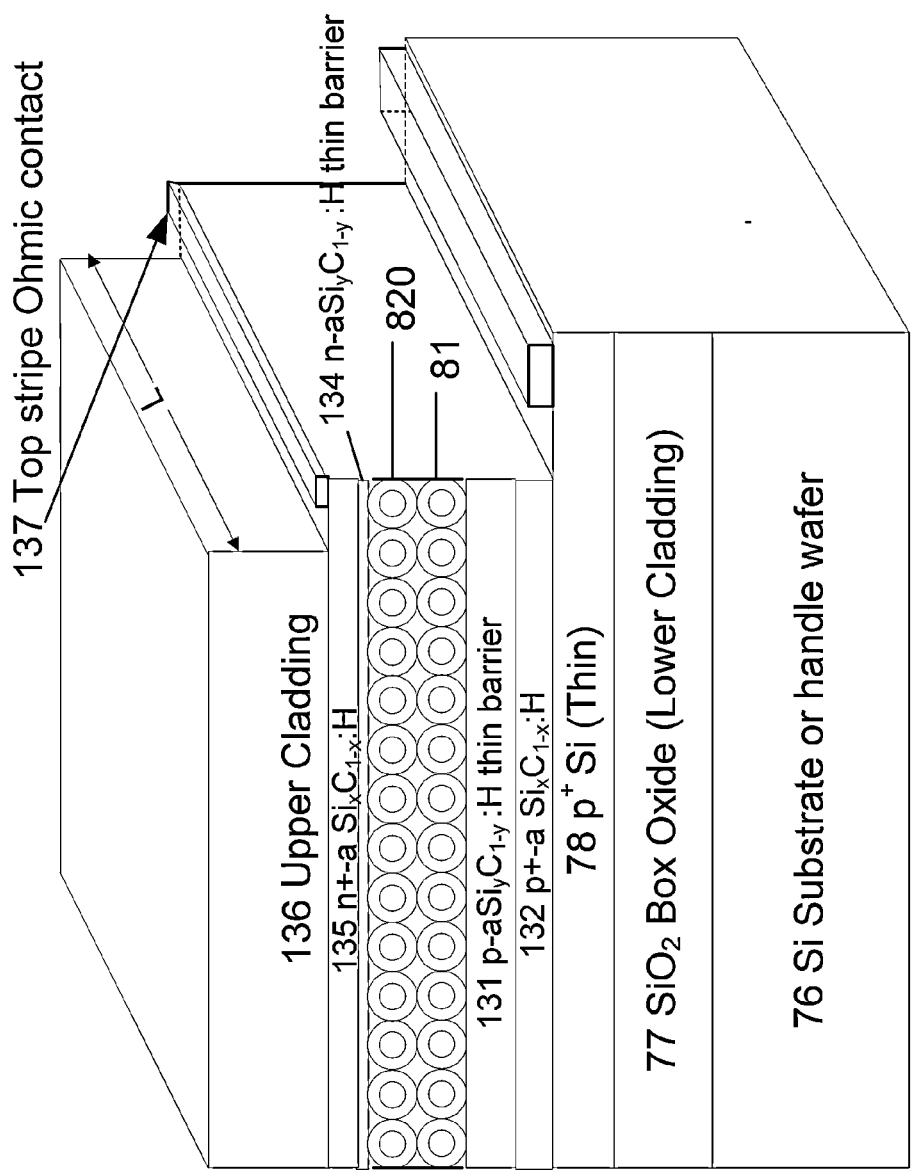
FIG. 12b shows an electrically-pumped Ge QDSL active layer where an amorphous n-Si layer is used as the injector of electrons into the QDSL, in accordance with an embodiment of the present invention.

The active layer may comprise $GeO_x$—Ge cladded dot layers and barrier layers 85, 86 and 80. The structure appears similar to that of FIG. 8a. The difference is that both electrons and holes are confined in the Ge quantum dots. The GeOx thin barriers and Ge dots in 2-dimensional or 3-dimensional array result in ultra-narrow mini energy bands corresponding to indirect and direct gap states. The injected minority carriers fill the indirect gap mini-band and overflow to mini-bands corresponding to direct gap states. This is envisioned as resulting in lasing at much lower current density than observed in Ge thin films. FIG. 12b shows an electrically-pumped Ge QDSL active layer where an amorphous n+—$Si_xC_{1-x}$:H layer 135 is used as the injector of electrons into the GeOx—Ge QDSL comprised of layers 81 and 820. (Here layer 820 does not have its top half of GeOx cladding etched like layer 82 in FIG. 12a). Holes are injected from layer 132. Layers 134 and 131 serves as the barrier layers with energy gap slightly lower than layers 135 and 132. The cladding layers are 77 and 136. Layer 136 is a lower index of refraction layer selected from SiO2, SiON, and Si3N4 and serves as the upper cladding. The Ohmic contacts are shown as 137 and 94. In one embodiment, the contact 94 could be made to contact layer 132.

Figure 12C:
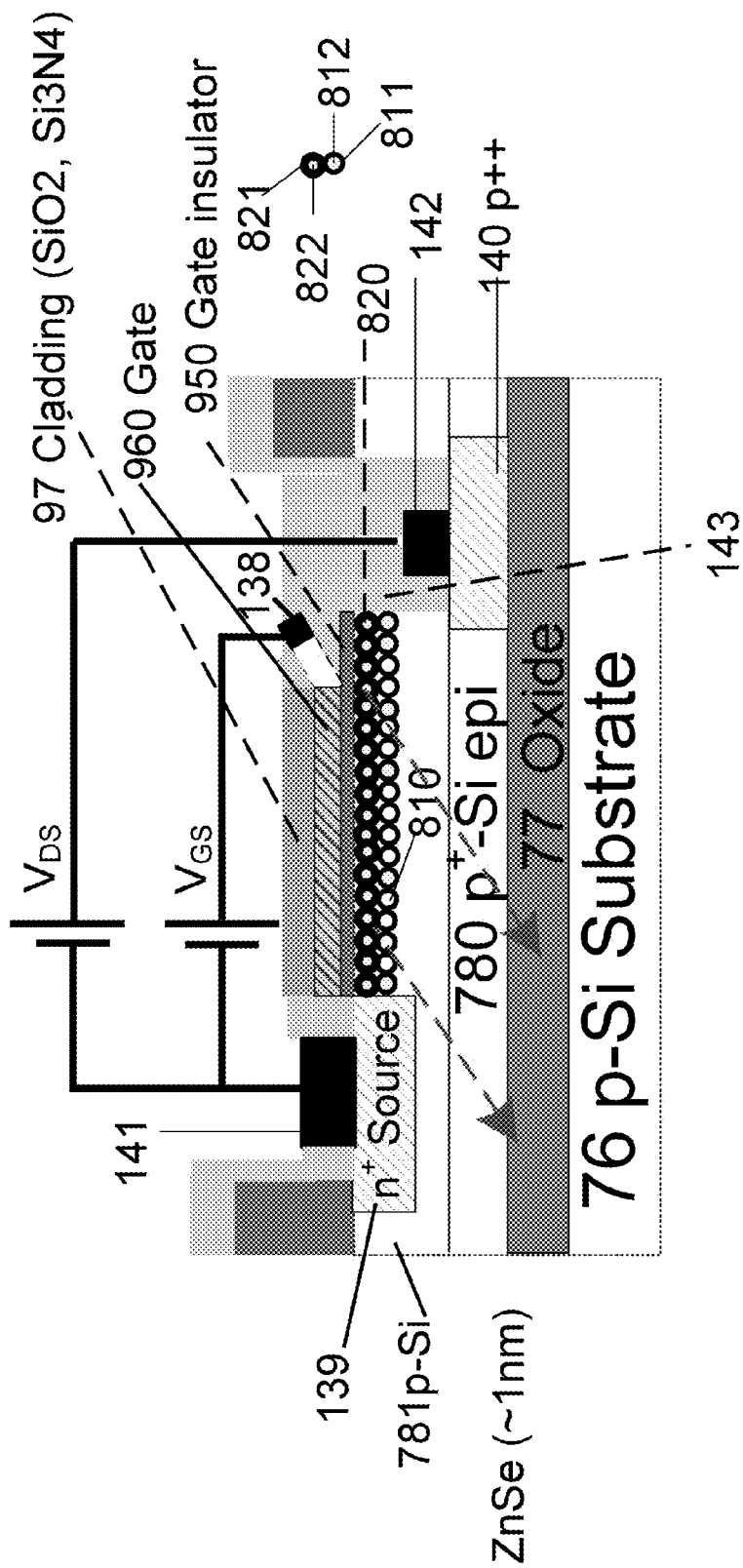
FIG. 12c shows an electrically-pumped MOS layer using Ge QDSL as channel, configured as a laser where lasing takes place via ultra-narrow mini-band in the conduction band corresponding to direct gap, in accordance with an embodiment of the present invention.

FIG. 12c shows an electrically-pumped MOS layer using Ge QDSL as channel, configured as a laser where lasing takes place via ultra-narrow mini-band in the conduction band corresponding to direct gap. Two layers GeOx-cladded Ge dot 810 and 820 (with their GeOx claddings 811 and 821 and Ge cores 812 and 822) of quantum dot array forms the inversion channel of the MOSFET. The source 139 provides electrons in the Ge quantum do channel when the gate voltage VGS is above threshold. The thin layer of gate insulator 950 is selected from insulators HfO2, Al2O3, SiO2, and the thin gate layer 960 is selected from TiN, TaN, metals, and doped polySi and doped poly Ge, depending on the threshold voltage desired. Holes are injected when a drain voltage VDS is applied to the p++ drain region 140 which is isolated from the quantum dot superlattice channel. The GeOx-Ge layers 810 and 820 are self-assembled on p-Si layer 781 which is deposited on layer 780. Unlike FETs, the drain region is isolated from the channel by an insulator region 143. The source 139 is contacted by 141, the drain 140 is connected by 142, and the gate 960 is connected by 138. The width of FET gate determines the laser cavity length and FET channel length (gate length) determines the laser width W. The upper cladding 97 is implemented by a low index layer 97, and the lower cladding is layer 77. Layers 781 and 780 are thin. The etching of facets forms the cavity of the MOS GeOx-Ge QDSL laser.

Figure 13:
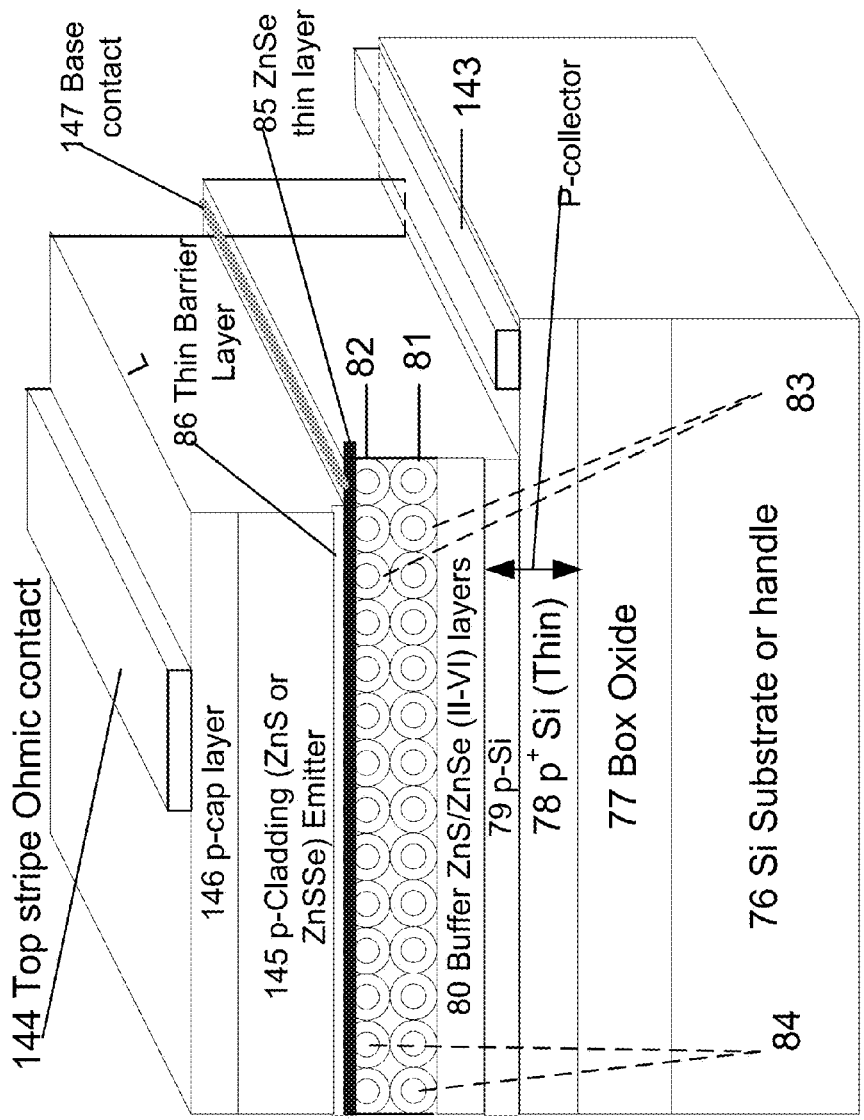
FIG. 13 shows an electrically-pumped Ge QDSL configured as a Heterojunction Bipolar Transistor (HBT) laser, in accordance with an embodiment of the present invention.

FIG. 13 shows an electrically-pumped Ge QDSL configured as a heterojunction bipolar transistor (HBT) laser. Here the structure of FIG. 12a is configured as a p-n-p transistor where Ge quantum dot layers (81 and 82) serve has the base and the active layer. The quantum dot layer 82 has its top part of cladding 83 removed and deposited with n-ZnSe layer 85. Layer 85 is deposited with a thin barrier layer 86 which is selected from ZnSSe, ZnMgSSe and other II-VI compatible semiconductors. Layer 145 serves as p-type emitter as well as upper cladding. It has a cap layer 146 which is contacted by a contact stripe 144. The other side of Ge quantum dot layer 81 is interfaced with a buffer 80 which serves as a barrier layer. The collector is formed by layers 79 and 78. Layer 77 serves as the lower cladding layer. Layer 79 may also be selected from p-ZnSSe and other II-VI layers. The collector contact is 143 and the base contact 147 which is deposited on layer 85. In other embodiments an n-p-n transistor is contemplated and envisioned.

It should be appreciated that a general methodology to obtain lasing in SiGe/Si, GaAsP/GaP, and other indirect gap materials is described herein. Several embodiments of laser structures are described using free carrier as well as excitonic transitions. In the case of free carrier transitions, direct gap in tensile strained Ge, GeOx—Ge quantum dot superlattice are described. In the case of excitons, increased density of excitons in the active layer to enhance optical gain and reduce the threshold current density by means including the use of quantum wells, wires, and dots (in relaxed or strained form) is disclosed. In the case of SiGe/Si or material systems that do not manifest adequate conduction and valence offsets ($\Delta E_c$ and $\Delta E_v$) in Type-I heterointerfaces to confine electrons and holes in the same quantum well layer, type-II heterointerfaces which separates electrons and holes in adjacent wells is described. The exciton binding energy is increased using an asymmetric coupled-quantum well which reduces the separation between electrons and holes.

While in other systems such as GaAsP/GaP where nitrogen (isoelectronic impurity) doping causes formation of bound excitons, we describe use of quantum wells, wires, and dots to enhance exciton binding energy, and thereby increasing the internal quantum efficiency and decreasing the lasing threshold current density. Methods using nanoislands and nanodot-mediated growth techniques, resulting in defect minimization in lattice-mismatched epitaxial growth, is disclosed. Distributed feedback and edge-emitting laser structures are contemplated and envisioned incorporating novel active layers disclosed in this invention. Surface emitting lasers are also envisioned incorporating novel active layers, using dielectric mirrors and second order Bragg gratings well known in the prior art. Multiple wavelength emitting laser structures are also envisioned using different band gap semiconductors in novel active layers in cooperation with the method of epitaxial growth disclosed herein. Moreover, amorphous semiconductor layers, interfacing single crystal layers and cladded quantum dots, are also disclosed to implement various laser structures and their modifications. Although figures are not provided to show pixels emitting different wavelength light, they are contemplated and envisioned in plain light-emitting or lasing structures that can be used in displays. Multiple color integration is envisioned to be in lateral configuration or vertically integrated configuration. In the case of vertical integration of colors, appropriate tunnel junctions may be used.

Accordingly, it should be appreciated that other materials and material combinations separately and in addition to those described herein may be used to implement the invention and method of the invention so long as they are suitable to the desired end purpose.

This invention describes structures and methodologies to obtain lasing in indirect gap semiconductors such as Ge and Si. It involves excitonic transitions in the active layer comprising of at least one indirect gap layer. Excitonic density is increased at a given injection current level by increasing their binding energy by the use of quantum wells, wires, and dots with and without strain. Excitons are formed by holes and electrons in two different layers that are either adjacent or separated by a thin barrier layer, where at least one layer confining electrons and holes is comprised of indirect gap semiconductor such as Si and Ge, resulting in high optical gain and lasing using optical and electrical injection pumping. In other embodiment, structures are described where excitons formed in an active layer confining electrons in the direct gap layer and holes in the indirect gap layer; where layers are adjacent or separated by a thin barrier layer. The carrier injection structures are configured as p-n junctions and metal-oxide-semiconductor (MOS) field-effect transistors. The optical cavity is realized to confine photons. In the case of MOS structures, electrons from the inversion layer, formed under the gate at voltages above threshold, are injected into one or more layers comprising of quantum wells (2-d), quantum wires (1-d) and quantum dots (0-d) structures. The confinement of photons emitted upon electron-hole recombination produces lasing in active layer comprising of dots/wells. Bipolar transistor structures can also be configured as lasers.

Still in another embodiment, lasing takes place in an active layer comprising of $GeO_x$—Ge cladded dots which forms a quantum dot superlattice (QDSL). The electron and holes are injected from a p-n junction into the layer comprising of $GeO_x$—Ge cladded dots. The QDSL thin barriers and dots result in ultra-narrow mini energy bands corresponding to indirect and direct gap states. The injected minority carriers fill the indirect gap mini-band and overflow into first mini-band corresponding to direct gap states. This would result in lasing at much lower current density than observed in Ge quantum wells and thin films Ge. In one embodiment, light emission and lasing takes place in tensile strained Ge quantum dots realized on Si substrates using nano-interface and nano-island formation techniques.

Moreover, methods of fabricating various structures are described using dislocations and defects reduction nano-interfaces on Si as well as Si-on-Insulator (SOI) substrates.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the scope thereof. Therefore, it is intended that the invention not be limited to the particular embodiment disclosed as the best mode contemplated for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

I claim:

1. a semiconductor laser structure comprising, an active layer, first and second barrier layers on either side of the active layer, first and second cladding layers, and a substrate, wherein the active layer includes a plurality of cladded Ge quantum dots, wherein the Ge quantum dot cladding is selected from GeOx, ZnMgSSe, ZnSe, ZnSSe, wherein each of plurality of the cladded Ge quantum dots have a 3-4 nm single crystal Ge core and a 0.5-1 nm cladding such that cladding between adjacent Ge cores range from 1-2 nm, wherein the plurality of cladded Ge quantum dots form superlattice like mini-energy bands that correspond to indirect and direct energy gap states, wherein the superlattice like mini-energy bands include a conduction mini-energy bands and a valence mini-energy bands, wherein conduction band includes indirect and direct energy bands, wherein the first and second barrier layers sandwich the plurality of cladded Ge quantum dot confine electrons in the conduction mini-energy bands and holes in the valence mini-energy bands, wherein the first barrier layer is disposed between the substrate and the active layer, and said second barrier layer is located on the other side of the active layer, wherein the active layer and two barrier layers form a waveguide region to confine photons, wherein the first and second barrier layers have energy gap greater than the energy gap between the conduction and valence mini-energy bands responsible for light emission from direct gap mini-energy band states of said plurality of cladded Ge quantum dot layer, wherein the first cladding layer is located between the substrate and the first barrier layer, wherein the second cladding layer is located on the second barrier layer, wherein the first and second cladding layers have an index of refraction configured to confine photons in the waveguide region, wherein photons are emitted when electrons and holes are injected in the plurality of cladded Ge quantum dots, wherein the first and second cladding layers are selected from materials that do not absorb photons and that have an energy gap greater than the energy gap due to mini-energy conduction band and valence bands of the active layer, wherein the active layer, first and second barrier layers, and the first and second cladding layers are configured to include at least one carrier injection mechanism selected from a p-n double heterojunction, a p-n single heterojunction, and a metal-oxide- semiconductor (MOS) device, wherein when the semiconductor laser structure is configured and baised as p-n double heterojunctions, p-n single heterojunction, and MOS device such that injected electron and hole populations are filling the indirect mini-energy band states and facilitating transitions between direct conduction mini-energy band and valence mini-energy band in the plurality of cladded Ge quantum dots, wherein the p-n double heterojunction is formed by the first and second barrier layers, and at least one of the first and second cladding layers, wherein the first and second cladding layer are configured to form either a p-n double heterojunction or a p-n single heterojunction, wherein the cladding layers are doped with opposite electrical conductivity type wherein doping concentration is in the range of $10^{18}$-$10^{19}$ cm$^{-3}$, wherein the substrate is selected from Si, Si-on-insulator, Ge-on-insulator, II-VI and III-V semiconductors, wherein when the semiconductor laser structure is configured as a metal-oxide semiconductor (MOS) device, it includes an n+-type source, a p+-type drain, a gate insulator layer and a gate layer, wherein the active layer comprising of cladded Ge quantum dots is disposed between the n+-type source and p+-type drain under the gate insulator layer, wherein the gate insulator layer serving as the second barrier layer, wherein when the gate layer and n+-type source are biased above a threshold voltage, wherein the n+-type source provides electrons to the plurality cladded Ge quantum dot layer which forms an inversion layer, wherein the gate layer is deposited with a second cladding layer, wherein the active layer comprising plurality of cladded Ge quantum dots, n+-type source and p+-type drain are disposed on p-semiconductor layer, wherein the p-semiconductor layer serving as the first barrier layer, wherein the p+-type drain is isolated from the inversion layer and the gate layer and supplies holes when n+-type source and p+-type drain are biased making p+-type drain positive than said n+-type source, wherein the p-semiconductor layer is disposed on the substrate wherein the substrate is configured to serve as the first cladding layer to confine emitted photons, wherein the semiconductor laser structure is configurable as either a cavity feedback type laser, or a distributed feedback laser, wherein the cavity feedback type laser structure is either an edge-emitting laser type or a surface-emitting configuration, wherein the distributed feedback laser type structure is either an edge-emitting type or a surface-emitting type.

2. The semiconductor laser structure of claim 1, wherein the active layer is configured as MOS type and wherein the gate insulator layer serves as the second barrier layer, and the second cladding is a layer selected from low index of refraction layer selected from $SiO_2$, $Si_3N_4$, SiON, and other oxides, and semiconductors, wherein the second cladding is disposed on the gate layer, wherein the gate layer material is selected from doped poly Si, doped poly Ge, doped poly Si—Ge, TaN, TiN, and other compatible metal and semiconductor layers, wherein the-gate layer is disposed on the gate insulator layer, wherein the active layer is disposed on a first barrier layer, wherein the first barrier layer is selected from p–Si, amorphous p–Si, pSi-on-ZnS, p–type III-V and II-VI semiconductors, wherein the first barrier is disposed on the first cladding layer, wherein the first cladding is disposed on a substrate, wherein said first cladding layer is the insulator layer in the silicon-on-insulator and Ge-on-insulator, amorphous-Si-on-glass substrates.

3. The semiconductor laser structure of claim 2, wherein said second cladding is comprised of at least two layers, and wherein the cladding layers are configured as a Bragg grating with high and low index of refraction regions, wherein the semiconductor laser structure is configured as a distributed feedback edge-emitting laser.

4. The semiconductor laser structure of claim 1, wherein the active layer comprising of plurality of cladded Ge quantum dots, and first and second barrier layers are configured as a double p-n heterojunction, wherein the first and second barrier layers are comprised of amorphous semiconductor having higher energy gap than the superlattice like mini-energy bands formed due to plurality of cladded Ge quantum dots, resulting in direct transitions, wherein the first and second barrier layers are comprised of amorphous semiconductor layer selected from $Si_yC_{1-y}$:H, and other higher energy gap semiconductors, said first and second barrier layers have adjacent doped amorphous semiconductor layers having higher energy gap $Si_xC_{1-x}$:H (x<y) than the first and second barrier layers, and wherein doping levels in the range greater than $10^{18}$-$10^{19}$ cm$^{-3}$, wherein the adjacent doped amorphous semiconductor layers having opposite conductivity type forming the p-n double heterojunction, said adjacent doped amorphous semiconductor layer under the first barrier layer is disposed on silicon-on-insulator substrate, wherein the silicon layer of the silicon-on-insulator substrate is highly doped and is of the same electrical conductivity type as the adjacent doped amorphous layer, wherein the insulator layer of the silicon-on insulator substrate serving as a first cladding, wherein the insulator layer on said silicon-on insulator substrate is SiO2, wherein the adjacent doped amorphous semiconductor layer on the second barrier layer has disposed on top of it a low index of refraction second cladding layer, wherein the second cladding layer is selected from SiO2, SiON, Si3N4, wherein the semiconductor laser structure is configured as edge-emitting.

5. The semiconductor laser structure of claim 4, where the second cladding is configured as a dielectric quarter wave minor with high and low index of refraction layers, said first cladding is configured as a dielectric quarter wave minor, wherein the semiconductor laser structure is configured as a surface emitting laser.

6. The semiconductor laser structure of claim 4, wherein the second cladding is comprised of at least two layers, and wherein the cladding layers are configured as a Bragg grating with high and low index of refraction regions, wherein the semiconductor laser structure is configured as a distributed feedback edge-emitting laser.

7. The semiconductor laser structure of claim 1, wherein the active layer comprises at least two upper and lower layer of GeOx cladded Ge quantum dots, wherein top part of the upper layer of GeOx-cladding of the cladded Ge quantum dots is replaced by ZnSe, ZnSSe, and other compatible II-VI semiconductor layer, wherein the ZnSe cladding on Ge dots serving as layer which nucleates thin second barrier layer, wherein the doped first and second cladding layers, active layer, first and second barrier layers are configured as a double p-n heterojunction.

8. The semiconductor laser structure of claim 1, wherein active layer is comprised of at least two layers of cladded Ge quantum dots, wherein each layer comprising of the active layer including a plurality of cladded Ge quantum dots, wherein the first layer of cladded Ge quantum dots having 3-4 nm single crystal Ge core and GeOx cladding of 1-2 nm, wherein the second layer of cladded Ge quantum dot layer having 3-4 nm Ge single crystal core and top part $ZnS_{1-x}Se_x$ cladding and bottom half $GeO_x$ cladding, wherein the plurality of cladded Ge quantum dots forming superlattice like mini-energy bands that correspond to indirect and direct energy gap states, wherein the cladded Ge quantum dot active layer is sandwiched between the first barrier layer and the second barrier layer, confining electrons in the conduction mini-energy bands and hole in the valence mini-energy bands of the plurality of cladded Ge quantum dots, wherein the first layer of cladded Ge quantum dots is disposed on first barrier layer selected from ZnS, ZnMgS, $ZnS_{1-x}Se_x$, and their combination, wherein second barrier layer is disposed on second layer of cladded Ge quantum dots, and wherein the second barrier layer is selected from $ZnS_{1-y}Se_y$ (y<x), ZnMgS, and their combinations, wherein the first barrier layer is grown on p–doped layer selected from Si, ZnS, ZnMgS, ZnSSe, said p–doped layer is grown on p+ doped layer selected from Si ZnS, ZnMgS, ZnSSe layer, wherein the p+ doped layer is grown on a substrate, and wherein the substrate is Si-on-insulator, wherein the insulator in Si-on-insulator substrate is $SiO_2$ layer, wherein the active layer and the first barrier layer and the second barrier layer forming a waveguide region, wherein the $SiO_2$ layer serving as the first cladding layer, wherein the second cladding layer is disposed on second barrier layer and wherein the second cladding layer is selected from n+-ZnS, ZnMgSSe, ZnMgTeSe, and ZnMgS, said first cladding layer and the second cladding layers having lower index of refraction than the waveguide region to confine photons which are emitted when electrons and holes are injected in the first layer and second layer comprising plurality of cladded Ge quantum dots, wherein the active layer, first barrier layer and second barrier layer, second cladding, and p–doped layer and p+ doped layer disposed under the first barrier layer are configured in the form of p-n double heterojunction, wherein the second cladding layer doped n+ type and the p+ doped layers are having Ohmic contact layers disposed adjacent to them, wherein the p-n heterojunction is forward biased to inject electron and hole populations filling the indirect mini-energy band states and facilitating transitions from the conduction band mini-energy band corresponding to direct gap states in said plurality of cladded Ge quantum dot constituting the active layer, wherein the doping in the n+ layer serving as the second cladding layer and p+ doped layer is in the range or greater than $10^{18}$-$10^{19}$ cm$^{-3}$ to facilitate carrier injection filling states corresponding to direct gap mini-energy band in the conduction band, wherein the semiconductor laser structure is configurable as either a cavity type or a distributed feedback type, wherein the cavity feedback type laser structure is either an edge-emitting laser type or a surface-emitting configuration, wherein the distributed feedback laser type structure is either an edge-emitting type or a surface-emitting type.

9. The semiconductor laser structure of claim 1, wherein active layer is comprised of first layer and second layer of cladded Ge quantum dots, wherein the first layer and the second layer including a plurality of cladded Ge quantum dots and wherein cladded Ge quantum dots having 3-4 nm single crystal Ge core and 1-2 nm $GeO_x$ cladding, wherein the plurality of cladded Ge quantum dots forming superlattice like mini-energy bands that correspond to indirect and direct energy gap states, wherein said first layer of cladded Ge quantum dot is near the substrate side, wherein the second layer including plurality of cladded Ge quantum dots is deposited with an insulator layer selected from $HfO_2$, $HfAlO_2$, $Al_2O_3$, $SiO_2$, SiON, $Si_3N_4$, wherein the insulator layer serving as the second barrier layer, wherein when the semiconductor laser structure is configured a metal-oxide-semiconductor device, it includes an n+-type source, a p+-type drain, a gate insulator layer, and a gate layer, and wherein the active layer comprising plurality of cladded Ge quantum dots is disposed between n+-type source and p+-type drain under the gate insulator layer, wherein the second barrier layer serving as a gate insulator layer, the gate insulator layer is deposited with a gate layer with material selected from doped poly Si, doped poly Ge, doped poly Si—Ge, TaN, TiN, and compatible metals, wherein the active layer comprising the first layer and the second layer including plurality of cladded Ge quantum dots, n+-type source and p+-type drain are disposed on p-semiconductor layer, wherein the p-semiconductor layer serving as the first barrier layer, and wherein the first barrier layer is selected from p–Si, ZnS, ZnS-on-pSi, ZnMgS, ZnMgS-on-pSi, wherein the first barrier layer is grown on p+-doped layer selected from Si, ZnS-on-Si, ZnMgS-on-Si, ZnSSe-on-Si, wherein the p+-type drain is electrically contacting the p+-doped layer, wherein the p+ doped layer is disposed on a substrate, wherein the substrate is selected from Si-on-insulator (SOI), Si-on-sapphire (SOS), ZnS-on-Si, ZnMgS-on-Si, wherein the low index of refraction layer such as SiO2 insulator in the SOT, ZnMgS in ZnMgS-on-Si, serve as the first cladding layer, wherein the active layer and the first barrier layer and the second barrier layer form a waveguide region, wherein a second cladding layer is disposed on said gate layer, and is selected from $HfO_2$, $HfAl0_2$, $Al_2O_3$, and $SiO_2$, SiON, and $Si_3N_4$, said n+-type source, p+-type drain and gate layers having electrical contacts for biasing the MOS device, wherein n+-type source supplying electrons to the plurality of cladded Ge quantum dots forming the superlattice when the gate layer and the n+-type source are biased above a threshold voltage, said p+ drain is isolated from the gate layer and supplies holes when n+-type source and p+-type drain are biased making p+-type drain positive than said n+-type source, wherein the first cladding and the second cladding layers having lower index of refraction than the waveguide region to confine photons which are emitted when electrons and holes are injected in the plurality of cladded Ge quantum dots in the active layer, said n+-type source and p+- type drain doping is in the range or greater than $10^{18}$-$10^{19}$cm$^{-3}$ to facilitate carrier injection filling states corresponding to direct mini-energy band in the conduction band, wherein the semiconductor laser structure is configurable as either a cavity type or a distributed feedback type,
wherein the cavity feedback type laser structure is either an edge-emitting laser type or a surface-emitting configuration,
wherein the distributed feedback laser type structure is either an edge-emitting type or a surface-emitting type.

10. The laser structure of claim 9, wherein the second cladding is constructed with at least two layers, wherein each layer have different index of refraction,
wherein the second cladding layer is configured as first order diffraction grating guiding photons to implement distributed feedback type edge-emitting laser.

11. A semiconductor laser structure comprising an active layer, first and second barrier layers on either side of active layer, first and second cladding layers, and a substrate,
wherein said active layer includes a plurality of Ge quantum dots,
wherein the Ge quantum dots are grown on first barrier layer selected from ZnSeTe, CdSSe, and other higher energy gap semiconductors,
wherein the first barrier layer has a lattice constant higher than Ge lattice constant resulting in ~2-3% tensile strain in the Ge quantum dots,
wherein the Ge quantum dots having a second barrier layer deposited on top with lattice constant similar to the first barrier layer to maintain the tensile strain in the Ge quantum dots,
wherein the second barrier layer has higher energy gap than the Ge quantum dots,
wherein the Ge quantum dots are nucleated in nanoislands, and wherein the nanoislands dimensions range from about 14 nm×14 nm to about 8 nm×8 nm,
wherein the nanoislands are surrounded by masking layers selected from thin layers of $SiO_2$, cladded $SiO_x$-Si nanodots self-assembled on doped p-regions, $HfO_2$, $Si_3N_4$, other oxides patterned using lithography, doping and etching techniques,
wherein said Ge quantum dots are grown using selective area epitaxy resulting in smaller dots than the size of said nanoislands,
wherein the first barrier layer is grown on at least one buffer layer selected from ZnS, ZnMgS, ZnSeMgTe, and ZnMgSSe layer,
wherein the buffer layer is grown on a Si layer,
wherein the Si layer is disposed on a substrate, and wherein substrate is selected from Si, silicon-on-$SiO_2$ insulator, Ge-on-insulator, ZnS-on-Si,
wherein either the buffer layer under the first barrier layer or the insulator layer in silicon-on-$SiO_2$ insulator, Ge-on-insulator substrtate or ZnS layer in ZnS-on-Si substrate serving as first cladding layer,
wherein the second barrier layer is deposited with second cladding layer, said active layer, first and second barrier layers, the buffer layer under the first barrier layer, and said first and second cladding layers are configured in the form of a p-n double heterojunction device,
wherein the p-n double heterojunction capable of injecting electrons and holes in the active layer comprising Ge quantum dots,
wherein doping of the first and second cladding layers in the range greater than $10^{18}$-$10^{19}$ $cm^{-3}$,
said semiconductor laser structure configured as either cavity type or distributed feedback type,
said cavity type laser structure is configured either as edge-emitting or surface emitting,
said distributed feedback type laser structure is configured either as edge-emitting or surface emitting.

12. The semiconductor laser structure of claim 11, wherein the Ge quantum dots in the active layer are fabricated by a nano-island formation technique,
wherein self-assembly of $SiO_x$-cladded Si nanodots forms nanoislands that are smaller than the lithographic patterning,
wherein the Si layer under the buffer layer is patterned with p–doped and n–doped regions, and wherein, the p-doped regions are laterally enlarged and n-doped regions are laterally reduced,
wherein the doped p-regions are laterally enlarged using rapid thermal annealing techniques,
wherein the Ge quantum dots are formed in nano-islands over the n–doped regions,
wherein n–doped regions are disposed with the first barrier layer and the buffer layer,
and wherein the first barrier and second barrier layers and Ge quantum dots are surrounded by $SiO_x$-Si nanodot mask layer,
wherein selective area epitaxial techniques are used to grow first barrier layer, Ge quantum dots, and second barrier layer.

13. The semiconductor laser structure of claim 12, where in the first barrier layer, selected from ZnSeTe, CdSSe, and wherein the first barrier layer is grown using nano-dot mediated technique,
wherein nanoislands are formed using patterned $SiO_2$ layer, wherein the active layer including plurality of Ge quantum dots is formed in the nanoislands surrounded by the $SiO_2$ layer.

14. The semiconductor laser structure of claim 11, comprising an active layer, first barrier layer and a second barrier layer on either side of the active layer, first cladding layer and a second cladding layer, a substrate
wherein the active layer includes a plurality of Ge quantum dots,
wherein the Ge quantum dots are grown on first barrier layer selected from $ZnSe_xTe_{1-x}$, $CdS_zSe_{1-z}$, and other higher energy gap semiconductors,
wherein the first barrier layer has a lattice constant higher than Ge lattice constant resulting in ~2-3% tensile strain in the Ge quantum dots,
wherein the Ge quantum dots are deposited with second barrier layer with lattice constant similar to the first barrier layer to maintain the tensile strain in the Ge quantum dots,
wherein the second barrier layer is selected from $ZnSe_xTe_{1-x}$, $CdS_zSe_{1-z}$, and other higher energy gap semiconductors,
wherein the plurality of Ge quantum dots, first barrier layer, second barrier layer are deposited in nanoislands with dimensions in the range of about 14 nm×14 nm to about 8 nm×8 nm,
wherein the nanoislands are surrounded by masking-regions comprised of cladded $SiO_x$-Si nanodots self-assembled on patterned doped p-regions using lithography, doping and etching techniques,
wherein the nanoislands having at least one Ge quantum dot nucleated in each nanoisland, wherein the Ge dots are grown using selective area epitaxy resulting in smaller dots than the size of the nanoislands,
wherein the first barrier layer is grown on at least one buffer layer selected from ZnS, ZnMgS, $ZnSe_yTe_{i-y}$, ZnMgSeTe, and ZnMgSSe layer,
wherein the buffer layer is grown on a Si layer, wherein the Si layer is patterned with n–doped regions and p–doped regions, wherein p–doped regions are created in many ways including using ion implantation of p–type dopants in n–doped Si layer and heat treatment creating p–doped regions using photomasking and lithographic techniques, wherein the SiO$_x$-cladded Si nanodots are self-assembled on p–doped regions in the Si layer, wherein the self-assembly of the SiO$_x$-cladded Si nanodots creates the masking regions surrounding the first barrier layer, Ge quantum dots, wherein the Si layer under the buffer layer and the self-assembled SiO$_x$-cladded Si nanodot masking regions is grown over a substrate, and wherein the substrate is selected from n+ZnS-on n+Si, n+ZnMgS-on n+Si, n+Si on insulator (SOI), wherein the SiO$_2$ insulator layer in SOI, n+ZnS, and n+ZnMgS layers serving as the first cladding layer, wherein the second barrier layer has disposed on it a second cladding layer, and wherein the second cladding layer is p+-doped, wherein the second cladding layer is selected from ZnSeTe, ZnSSeTe, and other semiconductors, said active layer, first barrier layer and second barrier layers, the buffer layer under the first barrier layer, and the first cladding layer, and second cladding layers are configured in the form of a p-n double heterojunction device, wherein when forward biased the p-n double heterojunction device is capable of injecting electrons and holes in the active layer comprising plurality of Ge quantum dots, wherein doping of the first cladding layer and the second cladding layer is in the range greater than $10^{18}$-$10^{19}$ cm$^{-3}$, the semiconductor laser structure configured as either cavity type or distributed feedback type, the cavity type laser structure is configured either as edge-emitting or surface emitting, the distributed feedback type laser structure is configured either as edge-emitting or surface emitting.

15. The laser structure of claim 14, wherein the first barrier layer is grown on buffer layer selected from ZnS, ZnMgS, ZnSe$_y$Te$_{1-y}$, and ZnMgSSe layer, wherein the buffer layer is deposited using a nanodot-mediated epitaxial layer, wherein the SiO$_x$-cladded Si nanodots masking regions forming the nanoislands and the nano-dot mediated techniques are used in cooperation reducing defects in the active layer, first barrier layer and second barrier layers, and the first cladding and second cladding layers.

16. A semiconductor laser structure comprising, an active layer, first barrier and second barrier layers, and first cladding and second cladding layers, and a substrate, wherein the active layer is comprised of a first layer and a second layer, wherein the first layer constituting the active layer is grown on the first barrier layer and the second barrier layer is deposited on the second layer constituting the active layer, wherein the first layer and the second layers forming the active layer are configured as quantum well, quantum wire, quantum dot or plurality of cladded quantum dots, wherein said first layer in said active layer is selected from indirect gap semiconductor, wherein said first layer semiconductors include Ge, Si, Si—Ge, InGaAs, quantum wells and wires, and GeO$_x$-Ge, SiOx-Si, Ge-ZnMgSSe, Ge-ZnSe, Ge-ZnSSe cladded quantum dots, wherein the first layer in the active layer confines holes, said second layer of the active layer is selected from direct gap semiconductors and confines electrons, said first and second layers in the active layer forming excitons by confinement of electrons and holes, wherein the first and second barrier layers having larger energy gap than first and second layers constituting the active layer, wherein first barrier layer is disposed on first cladding layer, and said second barrier layer is having adjacent to it a second cladding layer, wherein the active layer and first barrier and second barrier layers form a waveguide region to confine photons in cooperation with first cladding and second cladding layers, said active layer, first barrier and second barrier layers, and first cladding and second cladding layers are configured in the form of one carrier injection mechanism selected from a p-n double heterojunction, a p-n single heterojunction, and a metal-oxide- semiconductor (MOS) device, wherein when the semiconductor laser structure is configured as p-n single heterojunction, p-n double heterojunction and MOS device are biased such that holes are injected in and first layer of the active layer and electrons are supplied to second layer of the active layer, said first cladding and second cladding layers having lower index of refraction to confine photons which are emitted when electrons and holes are injected in the active layer, said first cladding and second cladding layers are selected from materials that do not absorb photons and have higher energy gap than the active layer, wherein the p-n double heterojunction is formed by said first cladding layer and second cladding layer selected from wide energy gap semiconductors in cooperation with said first barrier and second barrier layers, wherein the first cladding layer and the second cladding layer are doped with opposite electrical conductivity type with doping concentration in the range greater than $10^{18}$-$10^{19}$ cm$^{-3}$ to facilitate carrier injection in the active layer, wherein the first cladding layer is disposed on a substrate selected from Si, Si-on-insulator, Ge-on-insulator, II-VI and III-V semiconductors, wherein when the laser structure is configured as a metal-oxide semiconductor (MOS) device, it includes an n+-type source, a p+ type drain, a gate insulator layer and a gate layer, wherein the active layer is disposed between the n+-type source and p+-type drain under the gate insulator layer, wherein the gate insulator layer serving as the second barrier layer, wherein n+-type source supplying electrons to the second layer of the active layer when the gate layer and the n+-type source are biased above a threshold voltage, wherein the p+ type drain is isolated from the gate layer region, and supplies holes to the first layer of the active layer when n+-type source and p+-type drain regions are biased making p+-type drain positive than the n+-type source,
wherein the active layer comprising of first layer and second layer, n+-type source and p+-type drain are disposed on p-semiconductor layer, wherein the p-semiconductor layer serving as the first barrier layer,
wherein the first barrier layer is disposed on p+-semiconductor layer,
wherein the p+-semiconductor layer disposed on a substrate selected from Si, Si-on-insulator, Ge-on-insulator, II-VI and III-V semiconductors,
wherein the semiconductor laser structure is configured as either a cavity feedback laser or distributed feedback laser type,
wherein the cavity feedback type laser structure is either an edge-emitting laser type or a surface-emitting type,
wherein the distributed feedback type laser structure is either an edge-emitting type or a surface-emitting type.

17. The semiconductor laser structure of claim 16, wherein first layer of active layer confining holes and second layer of active layer confining electrons are separated by a third layer, wherein the third layer is comprised of a higher energy gap semiconductor than the first layer and the second layer, wherein the middle layer separates the confined holes in the first layer and electrons in the second layer.

18. The semiconductor laser structure of claim 16, wherein first layer of the active layer comprises of at least one layer including a plurality of cladded Ge quantum dots, and wherein the cladded Ge quantum dots having 3-4 nm Ge core and 1-2 nm $GeO_x$ cladding, and wherein the $GeO_x$ cladding serving as an electronic barrier between adjacent dots and the second layer constituting the active layer,
wherein said second layer constituting the active layer comprises CdSe, ZnTe quantum well and quantum dot layer,
wherein the first layer comprising cladded Ge quantum dots having the $GeO_x$ cladding on top part removed to expose Ge cores and wherein the exposed Ge cores are deposited with a thin barrier layer selected from ZnSe, ZnSSe, ZnMgSSe,
said thin barrier layer separating holes in the cladded Ge quantum dots and electrons in the second layer of the active layer.

19. The semiconductor laser structure of claim 16, wherein the first layer constituting the active layer is comprised of plurality of cladded Ge quantum dots, and wherein the cladded Ge quantum dots having 3-4 nm Ge cores and a 1-2 nm $GeO_x$ cladding, and wherein $GeO_x$ cladding serving as an electronic barrier between adjacent cladded Ge quantum dots,
wherein said cladded Ge quantum dots confining holes,
wherein said second layer constituting the active layer is comprised of amorphous Si, and
wherein the amorphous Si layer confining electrons,
wherein the second layer constituting the active layer is interfacing with a n+ type amorphous layer selected from Si:H, $Si_yC_{1-y}$:H,
the n+ type amorphous layer having adjacent layer serving as second cladding layer selected from $SiO_2$, SiON, $Si_3N_4$.

20. The semiconductor laser structure of claim 16, wherein the first layer and second layer constituting the active layer are implemented using indirect gap material,
wherein the indirect gap material is selected from GaAsP doped with nitrogen,
wherein the first layer and the second layer confining holes and electrons forming excitons.

* * * * *